(12) United States Patent
Sato

(10) Patent No.: US 6,879,614 B2
(45) Date of Patent: Apr. 12, 2005

(54) OPTICAL SEMICONDUCTOR DEVICE HAVING AN ACTIVE LAYER CONTAINING N

(75) Inventor: Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 240 days.

(21) Appl. No.: 10/213,072

(22) Filed: Aug. 7, 2002

(65) Prior Publication Data

US 2002/0195607 A1 Dec. 26, 2002

Related U.S. Application Data

(62) Division of application No. 09/688,875, filed on Oct. 17, 2000, now Pat. No. 6,449,299, which is a continuation of application No. 08/917,141, filed on Aug. 25, 1997, now Pat. No. 6,233,264.

(30) Foreign Application Priority Data

| Aug. 27, 1996 | (JP) | ............................................. 8-244244 |
| Aug. 28, 1996 | (JP) | ............................................. 8-245597 |
| Sep. 5, 1996 | (JP) | ............................................. 8-255413 |
| Oct. 4, 1996 | (JP) | ............................................. 8-283422 |
| Oct. 4, 1996 | (JP) | ............................................. 8-283424 |

(51) Int. Cl.$^7$ ............................................. H01S 5/00
(52) U.S. Cl. ....................................................... 372/45
(58) Field of Search ..................................... 372/43–50

(56) References Cited

U.S. PATENT DOCUMENTS

| 5,383,211 A | 1/1995 | Van de Walle et al. ....... 372/45 |
| 5,677,923 A | 10/1997 | Rice et al. ..................... 372/74 |
| 5,689,123 A | * 11/1997 | Major et al. ................. 257/190 |
| 5,710,439 A | 1/1998 | Ohkubo ........................ 257/85 |
| 5,719,894 A | 2/1998 | Jewell et al. .................. 372/45 |
| 5,805,624 A | 9/1998 | Yang et al. .................... 372/45 |
| 5,937,274 A | * 8/1999 | Kondow et al. .............. 438/47 |
| 6,233,264 B1 | 5/2001 | Sato |
| 6,449,299 B1 | 9/2002 | Sato ............................. 372/45 |

FOREIGN PATENT DOCUMENTS

JP        05-021907        1/1993

(Continued)

OTHER PUBLICATIONS

Kondow, et al.—"GaInNAs: A Novel Material for Long–Wavelength–Range Laser Diodes with Excellent High–Temperature Performance," Jpn. J. Appl: Phys., vol. 35, Part 1, No. 2B, Feb. 1996; pp. 1273–1275.

(Continued)

*Primary Examiner*—Quyen Leung
(74) *Attorney, Agent, or Firm*—Dickstein Shapiro Morin & Oshinsky LLP

(57) ABSTRACT

A laser diode includes a substrate, a lower cladding layer or a lower optical waveguide layer substantially free from Al and provided on the substrate, an active layer of a mixed crystal containing Ga and In as a group III element and N, As and/or P as a group V element, provided on the lower cladding layer; and an upper cladding layer or an upper optical waveguide layer substantially free from Al and provided on the active layer.

13 Claims, 18 Drawing Sheets

FOREIGN PATENT DOCUMENTS

| | | |
|---|---|---|
| JP | 05-275801 | 10/1993 |
| JP | 06-37355 | 2/1994 |
| JP | 06-037355 | 2/1994 |
| JP | 06-334168 A | 12/1994 |
| JP | 07-154023 A | 6/1995 |
| JP | 07-154023 | 6/1995 |
| JP | 07-193327 | 7/1995 |
| JP | 08-195522 | 7/1996 |
| JP | 08-195522 A | 7/1996 |
| JP | 09-219563 | 8/1997 |
| JP | 10-145003 | 5/1998 |

OTHER PUBLICATIONS

Nakahara, et al.—"Continuous–wave Operation of Long Wavelength GaInNAs/GaAs Quantum Well Laser," Electronics Letters, vol. 32, No. 17, Aug. 15, 1996, pp. 1585–1586.

M. Kondow, et al.—"A Novel Material of GaInNAs for Long–Wavelength–Range Laser Diodes with Excellent High–Temperature Performance," Extended Abstracts of the 1995 International Conference on Solid State Devices and materials, Osaka, 1995, pp. 1016–1018 (no month available).

* cited by examiner

F I G. 5
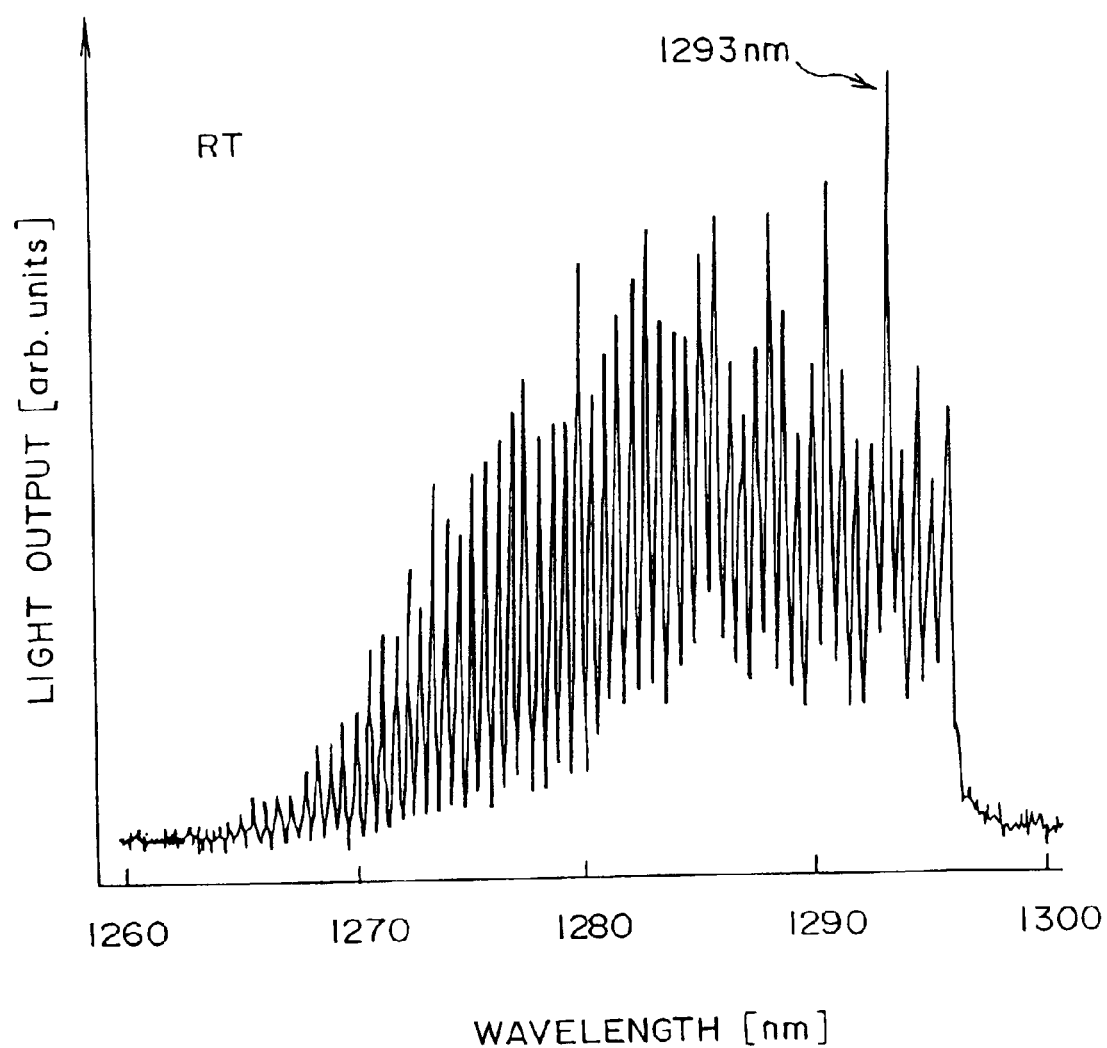

$\Delta Ec_1 < \Delta Ec_2$

OPTICAL SEMICONDUCTOR DEVICE HAVING AN ACTIVE LAYER CONTAINING N

This is a divisional of U.S. patent application Ser. No. 09/688,875, filed Oct. 17, 2000 now U.S. Pat. No. 6,449,299, which is a continuation of U.S. patent application Ser. No. 08/917,141, filed Aug. 25, 1997 now U.S. Pat. No. 6,233,264, the entire disclosures of which are incorporated herein by reference.

BACKGROUND OF THE INVENTION

The present invention generally relates to optical semiconductor devices and more particularly to an optical semiconductor device for use in a 1.3 μm or 1.5 μm wavelength band.

Optical wavelength band of 1.3 μm or 1.5 μm is used commonly in optical telecommunication systems that use optical fibers. It should be noted that a quartz glass optical fiber has an optical transmission band in the wavelength of 1.3 μm or 1.5 μm.

In correspondence to the foregoing specific optical transmission band of the optical fibers, conventional optical telecommunication systems generally use a laser diode constructed on an InP substrate. Such a laser diode typically uses an active layer of InGaPAs having a lattice constant matching the lattice constant of the InP substrate and a bandgap corresponding to the optical wavelength of 1.3 μm or 1.5 μm.

While the foregoing laser diode that uses InGaAsP active layer performs well in conventional optical telecommunication systems, particularly optical telecommunication trunks, the laser diode, requiring an expensive temperature regulation system such as a Peltier cooling device for a proper operation thereof, is deemed to be inappropriate for optical subscriber systems such as optical home terminals because of the increased cost of the temperature regulation system. In the foregoing laser diode that uses the InGaPAs active layer in combination with the InP substrate, the discontinuity of conduction band at the interface between the active layer and the surrounding cladding layer or optical waveguide layer is not sufficient for effective confinement of the carriers in the active layer, and there is a tendency that the carriers escape or overflow from the active layer when the device is not properly cooled. Because of such a poor confinement of the carriers, the laser diode generally shows a poor efficiency of laser oscillation. This problem becomes particularly serious in a high temperature operation of the laser diode where the carriers experience extensive thermal excitation.

On the other hand, recent investigations on a GaAs—GaN system have discovered that the bandgap of a GaAs mixed crystal containing therein a small amount of N decreases with increasing N content in the GaAs mixed crystal. GaN itself has been known to have a very large bandgap and is used for an active layer of an LED or laser diode that emits a blue or violet optical radiation.

FIG. 1 shows the bandgap of such a GaAs—GaN mixed crystal system together with other group III–V compound semiconductor materials (Kondow, M., et al., Extended Abstracts of the 1995 International Conference on Solid State Devices and Materials, Osaka, 1995, pp. 1016–1018).

Referring to FIG. 1, it should be noted that, while GaN or a mixed crystal thereof containing a small amount of As has a very large bandgap suitable for emission of blue or violet optical radiation, the mixed crystal of GaAs containing a small amount of N has a small bandgap suitable for emission of the 1.3 μm or 1.5 μm optical wavelength band used for optical telecommunications systems. It should be noted that the bandgap of the GaAs mixed crystal decreases rapidly with increasing N content therein. Further, FIG. 1 indicates that the lattice constant of the GaAs mixed crystal decreases substantially with increasing N content therein.

Thus, the Japanese Laid-Open Patent Publication 6-334168 describes a technology of growing a III–V mixed crystal film containing N on a Si substrate epitaxially. For example, the foregoing reference describes a laser diode and a photodiode that use a GaNP cladding layer having a composition of $GaN_{0.03}P_{0.97}$ in combination with an active layer having a strained superlattice structure in which a GaNP layer and a GaNAs layer are stacked alternately and repeatedly. The foregoing cladding layer successfully establishes a lattice matching with the Si substrate. According to the teaching of the foregoing reference, it becomes possible to form a III–V device on a Si substrate without inducing misfit dislocations in the epitaxial layers. Further, the disclosed technology enables formation of an integrated circuit in which the III–V optical semiconductor devices are integrated monolithically with other Si devices.

Further, various mixed crystal compositions that establish a lattice matching with a substrate of GaAs, InP or GaP are reported for various N-containing III–V systems such as GaInNAs, AlGaNAs and GaNAs in the Japanese Laid-Open Patent Publications 6-037355.

Conventionally, no III–V composition has been known that has a bandgap smaller than the bandgap of GaAs and simultaneously a lattice constant that matches the lattice constant of GaAs, until a mixed crystal of GaInNAs is discovered. Provided that the N content is held small, the GaInNAs mixed crystal successfully establishes a lattice matching with a GaAs substrate and simultaneously has a bandgap smaller than the bandgap of GaAs. See the band diagram of FIG. 1. Thus, the GaInNAs mixed crystal is thought to be a promising material for an active layer of an optical semiconductor device that operates in the 1.3 μm or 1.5 μm wavelength band. However, little is known about the properties of the mixed crystal of GaInNAs.

Thus, Kondow, M., et al., op. cit., proposes a laser diode structure that uses a GaInNAs mixed crystal for the active layer of a laser diode. The reference further discloses the use of a cladding layer of AlGaAs in contact with the active layer of GaInNAs for securing a large discontinuity in the conduction band at the heterojunction interface across the cladding layer and the active layer. Because of the very large band discontinuity at the heterojunction interface, the laser diode is expected to show a high efficiency of laser oscillation and improved temperature characteristic associated with an efficient confinement of the carriers in the active layer.

On the other hand, It is known that the epitaxial growth of a GaInNAs mixed crystal is substantially difficult at high temperatures because of the tendency of the N atoms escaping from the deposited epitaxial layer of GaInNAs In order to obtain a film containing a substantial amount of N atoms, it is necessary to carry out the deposition process at a temperature of about 680° C. or less. However, the epitaxial growth at such a low temperature is not preferable for the growth of a layer containing Al, such as a layer of AlGaAs used for the cladding layer, because of the tendency of the highly reactive Al atoms in the cladding layer reacting with a small amount of O atoms remaining in the deposition chamber or in the source gases as impurity. The O atoms thus incorporated form a non-optical recombination center in the epitaxial layer, while the non-optical recombination centers thus formed tend to annihilate the carriers without emitting photons. It should be noted that the problem of oxidation of Al cannot be avoided even when the deposition is carried out under an environment where the air is purged by a high-performance vacuum system.

In order to avoid the foregoing problem of incorporation of the O atoms into the cladding layer of AlGaAs, it is necessary to carry out the deposition of the cladding layer at a high temperature of at least 750° C. However, the use of such a high temperature growth is contradictory to the requirement of low temperature growth of the GaInNAs active layer as noted previously. Even in the case in which the substrate temperature is lowered after the deposition of the cladding layer of AlGaAs for allowing the deposition of the GaInNAs layer thereon, such a lowering of the substrate temperature also allows unwanted incorporation of the O atoms in the reaction chamber to the exposed surface of the lower cladding layer, and the formation of non-optical recombination centers at the heteroepitaxial interface between the lower cladding layer and the active layer is inevitable. It should be noted that the non-optical recombination centers reduce the lifetime of the optical semiconductor device such as a laser diode.

In addition to the foregoing problem, the inventor of the present invention has discovered that a direct epitaxial growth of a GaInNAs layer on an AlGaAs layer is difficult, as in the case of forming a laser diode that uses a cladding layer of AlGaAs in combination with the GaInNAs active layer.

FIG. 2 shows the surface morphology of a GaInNAs layer grown directly on an epitaxial layer of AlGaAs, which in turn is grown on a GaAs substrate. The GaInNAs layer is grown with a thickness of 0.1 μm and has a composition of $Ga_{0.9}In_{0.1}N_{0.03}As_{0.97}$ for a successful lattice matching to the GaAs substrate. The AlGaAs layer underlying the GaInNAs layer has a composition of $Al_{0.4}Ga_{0.6}As$ and is grown with a thickness of about 0.2 μm.

Referring to FIG. 2, it will be noted that the surface of the GaInNAs layer is not smooth but includes minute projections and depressions, indicating a non-uniform or island-like growth of the GaInNAs layer occurring on the surface of the AlGaAs layer. The GaInNAs layer having such an irregular surface morphology performs poorly when used for the active layer of a laser diode due to various reasons such as scattering of light at the irregular surface or non-optical recombination of the carriers caused by the defects that accompany with such irregular heteroepitaxial interface.

Thus, it has been difficult to fabricate a double hetero laser diode that uses a III–V layer containing N for the active layer.

SUMMARY OF THE INVENTION

Accordingly, it is a general object of the present invention to provide a novel and useful optical semiconductor device wherein the foregoing problems are eliminated.

Another and more specific object of the present invention is to provide an optical semiconductor device operable in a 1.3 μm or 1.5 μm optical wavelength band without a temperature regulation.

Another object of the present invention is to provide an optical semiconductor device that includes an active layer containing N atoms therein, wherein a large band discontinuity is secured between the active layer and a cladding layer while reducing non-optical recombination centers simultaneously.

Another object of the present invention is to provide an optical semiconductor device, comprising:

a substrate;

a lower cladding layer substantially free from Al and provided on said substrate;

an active layer of GaInNPAs provided on said lower cladding layer; and an upper cladding layer substantially free from Al and provided on said active layer.

According to the present invention, the upper and lower cladding layers are free from Al. Thus, the oxidation of Al in the upper or lower cladding layer at the time of low-temperature deposition of the active layer is successfully avoided, by using a mixed crystal of GaInNPAs for the active layer, it becomes possible to achieve a photoelectronic interaction in the active layer for an optical radiation having a 1.3 μm or 1.5 μm band.

Another object of the present invention is to provide a laser diode, comprising:

a substrate of GaAs having a first conductivity type;

a lower cladding layer of a semiconductor material having said first conductivity type and provided on said substrate, said lower cladding layer having a composition substantially free from Al;

an active layer of a group III–V compound semiconductor material provided on said lower cladding layer, said active layer containing Ga and In as a group III element and N and As as a group V element;

an upper cladding layer of a semiconductor material having a second, opposite conductivity type and provided on said active layer, said upper cladding layer having a composition substantially free from Al;

a contact layer of a group III–V compound semiconductor material having said second conductivity type and provided on said upper cladding layer;

a first ohmic electrode provided in ohmic contact with said contact layer; and a second ohmic electrode provided in ohmic contact with said substrate.

According to the present invention, the upper and lower cladding layers are free from Al. Thus, the oxidation of Al in the upper or lower cladding layer at the time of low-temperature deposition of the active layer is successfully avoided. By using the group III–V semiconductor material containing Ga, In, N and As in combination with the GaAs substrate, the laser diode oscillates successfully in the 1.3 μm wavelength band with high efficiency. As the carriers are confined effectively in the active layer in the laser diode of the present invention, the laser diode is operable without external cooling. By setting the composition of the active layer in lattice matching to the GaAs substrate, the active layer can be formed with a desired thickness, without inducing a lattice misfit strain therein. Thereby, the laser diode can have a double-hetero structure in which the active layer having a thickness suitable for acting as an optical waveguide is sandwiched directly by the cladding layers.

Another object of the present invention is to provide laser diode, comprising:

a substrate of GaAs having a first conductivity type;

a lower cladding layer of AlGaAs having said first conductivity type and provided on said substrate without accumulating a substantial lattice misfit strain;

a lower optical waveguide layer of GaInPAs provided on said lower cladding layer;

an active layer of a GaInNAs provided on said lower optical waveguide layer, said active layer being substantially free from a lattice misfit strain;

an upper optical waveguide layer of GaInPAs provided on said active layer;

an upper cladding layer of AlGaAs doped to a second, opposite conductivity type and provided on said upper optical waveguide layer without accumulating a substantial lattice misfit strain;

a contact layer of a group III–V compound semiconductor material having said second conductivity type and provided on said upper cladding layer;

a first ohmic electrode provided in ohmic contact with said contact layer; and a second ohmic electrode provided in ohmic contact with said substrate.

According to the present invention, the upper and lower optical waveguide layers directly in contact with the active layer are free from Al. Thus, the oxidation of Al in the upper or lower optical waveguide layers at the time of low-temperature deposition of the active layer is successfully avoided. By using GaInPAs for the optical waveguide layers sandwiching the active layer, the carriers injected to the laser diode are confined effectively in the active layer as compared with the case of using GaAs for the optical waveguide layers due to the increased bandgap energy of GaInPAs that achieves a lattice matching to the GaAs substrate.

Another object of the present invention is to provide a laser diode, comprising:

a substrate of GaAs having a first conductivity type;

a lower cladding layer of AlGaAs having said first conductivity type and provided on said substrate;

a lower optical waveguide layer of GaInPAs provided on said lower cladding layer;

an active layer of a GaInNAs provided on said lower optical waveguide layer, said active layer having a bandgap energy corresponding to a 1.3 $\mu$m optical wavelength;

an upper optical waveguide layer of GaInPAs provided on said active layer;

an upper cladding layer of AlGaAs having a second, opposite conductivity type and provided on said upper optical waveguide layer;

a contact layer of a group III–V compound semiconductor material having said second conductivity type and provided on said upper cladding layer;

a first ohmic electrode provided in ohmic contact with said contact layer; and a second ohmic electrode provided in ohmic contact with said substrate.

According to the present invention, the upper and lower optical waveguide layers directly in contact with the active layer are free from Al. Thus, the oxidation of Al in the upper or lower optical waveguide layers at the time of the low-temperature deposition of the active layer is successfully avoided. By using AlGaAs for the upper and lower optical waveguide layers, the thermal resistance of the cladding layer is reduced substantially, and the high-temperature stability of the laser diode operation is improved substantially. By using a mixed crystal of GaInNAs that contains N for the active layer of the laser diode, a laser oscillation in the 1.3 $\mu$m band is successfully achieved while simultaneously achieving a lattice matching between the active layer and the GaAs substrate. By increasing the In content in the active layer, the bandgap of the mixed crystal forming the active layer is reduced and the laser oscillation wavelength is increased for the mixed crystal composition of the active layer in which the N content is reduced. By reducing the N content of the active layer as such, the quality of the crystal forming the active layer is improved, and the efficiency of laser oscillation and the laser oscillation spectrum are improved substantially.

Another object of the present invention is to provide a laser diode, comprising:

a substrate of GaAs having a first conductivity type;

a lower cladding layer of AlGaInP having said first conductivity type and provided on said substrate;

a lower optical waveguide layer of GaInPAs provided on said lower cladding layer;

an active layer of a GaInNAs provided on said lower optical waveguide layer, said active layer having a bandgap energy corresponding to a 1.3 $\mu$m optical wavelength;

an upper optical waveguide layer of GaInPAs provided on said active layer;

an upper cladding layer of AlGaInP doped to a second, opposite conductivity type and provided on said upper optical waveguide layer;

a contact layer of a group III–V compound semiconductor material having said second conductivity type and provided on said upper cladding layer;

a first ohmic electrode provided in ohmic contact with said contact layer; and a second ohmic electrode provided in ohmic contact with said substrate.

According to the present invention, the upper and lower optical waveguide layers directly in contact with the active layer are free from Al. Thus, the oxidation of Al in the upper or lower optical waveguide layers at the time of low-temperature deposition of the active layer is successfully avoided. By using a mixed crystal of GaInNAs that contains N for the active layer of the laser diode, a laser oscillation in the 1.3 $\mu$m band is successfully achieved while simultaneously achieving a lattice matching between the active layer and the GaAs substrate. By using GaInPAs for the upper and lower optical waveguide layers, a large band discontinuity is secured at the interface between the optical waveguide layer and the active layer, and the carriers injected to the laser diode are confined into the active layer with high efficiency. Thereby, the laser diode shows an excellent high temperature performance.

Another object of the present invention is to provide a laser diode, comprising:

a substrate of GaAs having a first conductivity type;

a lower cladding layer having said first conductivity type and provided on said substrate;

a lower optical waveguide layer of GaInPAs provided on said lower cladding layer;

an active layer provided on said lower optical waveguide layer, said active layer comprising an alternate repetition of a quantum well layer of GaInNAs and a barrier layer of GaInPAs;

an upper optical waveguide layer of GaInPAs provided on said active layer;

an upper cladding layer doped to a second, opposite conductivity type and provided on said upper optical waveguide layer;

a contact layer of a group III–V compound semiconductor material having said second conductivity type and provided on said upper cladding layer;

a first ohmic electrode provided in ohmic contact with said contact layer; and a second ohmic electrode provided in ohmic contact with said substrate;

each of said quantum well layers accumulating therein a compressional lattice misfit strain and each of said barrier layers accumulating therein a tensile lattice misfit strain.

According to the present invention, the upper and lower optical waveguide layers directly in contact with the active layer are free from Al. Thus, the oxidation of Al in the upper or lower optical waveguide layers at the time of low-temperature deposition of the active layer is successfully avoided. By forming a strained superlattice structure in the active layer by the quantum well layers of GaInNAs and the barrier layers of GaInPAs, it is possible to reduce the bandgap energy and increase the oscillation wavelength of the laser diode while simultaneously reducing the N content in the quantum well layers. Thereby, the quality of the crystal forming the quantum well layers is improved substantially and an efficient laser oscillation is achieved with a sharply defined oscillation spectrum.

Another object of the present invention is to provide a laser diode, comprising:

a substrate of GaAs having a first conductivity type;

a lower cladding layer having said first conductivity type and provided on said substrate;

a lower optical waveguide layer of GaInPAs provided on said lower cladding layer;

an active layer provided on said lower optical waveguide layer, said active layer comprising an alternate repetition of a quantum well layer of GaInNAs and a barrier layer of GaInNPAs;

an upper optical waveguide layer of GaInPAs provided on said active layer;

an upper cladding layer doped to a second, opposite conductivity type and provided on said upper optical waveguide layer;

a contact layer of a group III–V compound semiconductor material having said second conductivity type and provided on said upper cladding layer;

a first ohmic electrode provided in ohmic contact with said contact layer; and a second ohmic electrode provided in ohmic contact with said substrate.

said quantum well layers accumulating therein a compressional lattice misfit strain and said barrier layers accumulating therein a tensile lattice misfit strain.

According to the present invention, the upper and lower optical waveguide layers directly in contact with the active layer are free from Al. Thus, the oxidation of Al in the upper or lower optical waveguide layers at the time of low-temperature deposition of the active layer is successfully avoided. By forming a strained superlattice structure in the active layer by the quantum well layers and the barrier layers, it is possible to reduce the bandgap energy and increase the oscillation wavelength of the laser diode while simultaneously reducing the N content in the quantum well layers. Thereby, the quality of the crystal forming the quantum well layers is improved substantially and an efficient laser oscillation is achieved with a sharply defined oscillation spectrum. Further, the laser diode of the present invention is easy to fabricate, as the quantum well layers and the barrier layers are formed in the same deposition apparatus by merely switching the supply of a source of P on and off repeatedly.

Another object of the present invention is to provide a laser diode, comprising:

a substrate of GaAs having a first conductivity type;

a lower cladding layer of GaInP having said first conductivity type and provided on said substrate;

a lower optical waveguide layer of GaInPAs provided on said lower cladding layer;

an active layer of GaInNPAs having a bandgap energy in a $0.8\,\mu m$ band and provided on said lower optical waveguide layer;

an upper optical waveguide layer of GaInPAs provided on said active layer;

an upper cladding layer of GaInP having a second, opposite conductivity type and provided on said upper optical waveguide layer;

a contact layer provided on said upper cladding layer;

a first ohmic electrode provided in ohmic contact with said contact layer; and a second ohmic electrode provided in ohmic contact with said substrate.

According to the present invention, the upper and lower optical waveguide layers directly in contact with the active layer are free from Al. Thus, the oxidation of Al in the upper or lower optical waveguide layers at the time of low-temperature deposition of the active layer is successfully avoided. By using a mixed crystal of GaInNPAs for the active layer, the laser diode oscillates successfully at an optical wavelength of about 0.81 $\mu m$. As a very large band-discontinuity is secured in the laser diode of the present invention that uses GaInP for the cladding layer, the laser diode has an excellent high temperature performance and is suitable for high power applications.

Another object of the present invention is to provide a laser diode, comprising:

a substrate of InP having a first conductivity type;

a lower cladding layer of InP having said first conductivity type and provided on said substrate;

an active layer of a GaInNPAs provided on said lower cladding layer;

an upper cladding layer of InP having a second, opposite conductivity type and provided on said active layer;

a contact layer of a group III–V compound semiconductor material having said second conductivity type and provided on said upper cladding layer;

a first ohmic electrode provided in ohmic contact with said contact layer; and a second ohmic electrode provided in ohmic contact with said substrate.

According to the present invention, the upper and lower cladding layers directly in contact with the active layer are free from Al. Thus, the oxidation of Al in the upper or lower optical waveguide layers at the time of low-temperature deposition of the active layer is successfully avoided. By using a mixed crystal of GaInNPAs for the active layer, the laser diode oscillates successfully at an optical wavelength band of about 1.5 $\mu m$. As the carriers are confined effectively in the active layer in the laser diode of the present invention, the laser diode is operable without external cooling. By setting the composition of the active layer in lattice matching to the InP substrate, the active layer can be formed with a desired thickness, without inducing a lattice misfit strain therein. Thereby, the laser diode can have a double-hetero structure in which the active layer having a thickness suitable for acting as an optical waveguide is sandwiched directly by the cladding layers.

Another object of the present invention is to provide a laser diode, comprising:

a substrate of InP having a first conductivity type;

a lower cladding layer of InP having said first conductivity type and provided on said substrate;

a lower optical waveguide layer of GaInPAs provided on said lower cladding layer;

an active layer provided on said lower optical waveguide layer, said active layer comprising an alternate repetition of a quantum well layer of GaInNPAs and a barrier layer of GaInPAs;

an upper optical waveguide layer of GaInPAs provided on said active layer;

an upper cladding layer of InP having a second, opposite conductivity type and provided on said upper optical waveguide layer;

a cap layer provided on said upper cladding layer;

a first ohmic electrode provided in ohmic contact to said cap layer; and a second ohmic electrode provided in ohmic contact to said substrate.

According to the present invention, the upper and lower optical waveguide layers directly in contact with the active layer are free from Al. Thus, the oxidation of Al in the upper or lower optical waveguide layers at the time of low-temperature deposition of the active layer is successfully avoided. By using a mixed crystal of GaInNPAs for the active layer, the laser diode oscillates successfully at an optical wavelength band of about 1.5 $\mu$m. As the carriers are confined effectively in the active layer in the laser diode of the present invention as a result of the use of InP cladding in combination with the GaInNPAs active layer, the laser diode is operable at high temperatures without external cooling.

Another object of the present invention is to provide a laser diode, comprising:

a substrate having a first conductivity type;

a lower cladding layer having said first conductivity type and provided on said substrate;

an active layer of a group III–V compound semiconductor material containing Ga and In as a group III element and N and As as a group V element;

an upper cladding layer having a second, opposite conductivity type and provided on said active layer;

a current confinement structure provided on said upper cladding layer, said current confinement structures including first and second patterns disposed on said upper cladding layer at both lateral sides of an optical axis of said laser diode when viewed perpendicularly to said substrate so as to expose a part of said upper cladding layer along said optical axis, each of said first and second patterns being formed of a group III–V compound semiconductor material containing Ga and In as a group III element and N and As as a group V element, said first and second patterns having said first conductivity type and a bandgap energy not exceeding a bandgap energy of said active layer;

a second upper cladding layer of said second conductivity type provided on said current confinement structure so as to cover said first and second patterns forming said current confinement structure and in contact with said exposed part of said upper cladding layer;

a contact layer of said second conductivity type provided on said second upper cladding layer;

a first ohmic electrode provided in ohmic contact with said contact layer; and a second ohmic electrode provided in ohmic contact with said substrate.

According to the present invention, the first and second patterns, formed of a mixed crystal containing Ga, In, N and As, effectively absorb the optical radiation produced in the active layer. Thereby, the refractive index of the first and second patterns is changed and an optical waveguide structure confining an optical radiation laterally along the optical axis of the laser diode is formed along the axial direction of the laser diode. In other words, the optical radiation produced in the active layer is confined effectively in the lateral direction, and the stimulated emission of photons is substantially facilitated as the optical beam is guided by the optical waveguide structure thus formed back and forth in the axial direction of the laser diode. As the first and second patterns are formed to have the first conductivity type, the confinement of the carriers occurs also to the exposed part of the upper cladding layer that contacts with the second upper cladding layer. It is preferred to form the first and second patterns of the same material forming the active layer.

Other objects and further features of the present invention will become apparent from the following detailed description when read in conjunction with the attached drawings.

BRIEF DESCRIPTION OF THE DRAWINGS

FIG. 5 is a laser oscillation spectrum obtained for the laser diode of the first embodiment;

DETAILED DESCRIPTION OF THE PREFERRED EMBODIMENTS

[First Embodiment]

Figure 3:
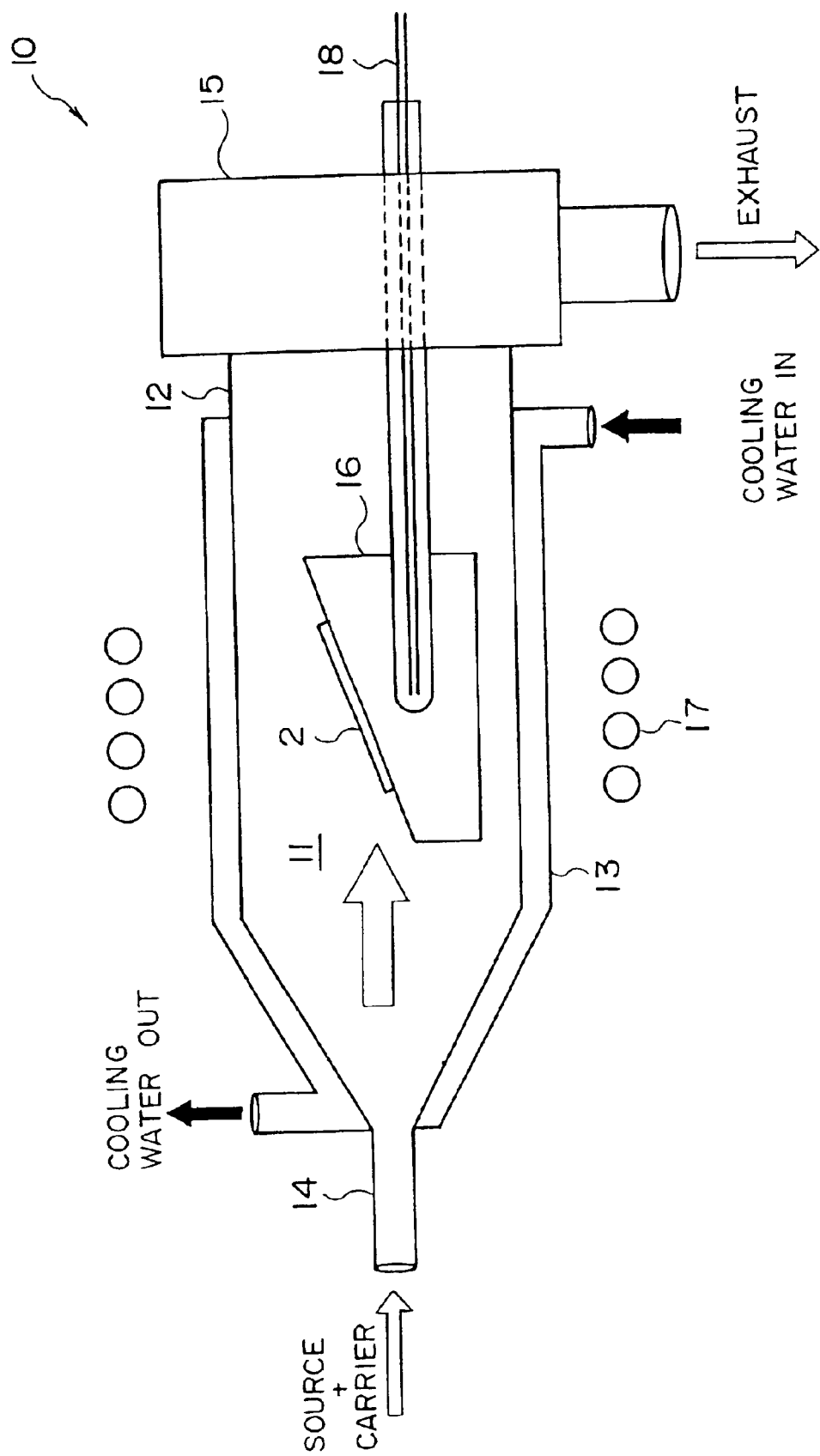
FIG. 3 is a diagram showing a horizontal MOVPE apparatus used in the present invention for growing various group III–V semiconductor epitaxial layers.

FIG. 3 shows the construction of a deposition apparatus 10 used in the present invention for fabricating epitaxial layers forming the optical semiconductor device of the present invention.

Referring to FIG. 3, the deposition apparatus 10 is a horizontal type apparatus and includes a quartz glass reactor 12 defining therein a reaction chamber 11, wherein a cooling jacket is provided so as to surround the reactor 12 for water cooling. Further, the reactor 12 includes an inlet 14 for introducing various gaseous sources into the reaction chamber 11 together with a carrier gas. Further, the reaction chamber 11 is evacuated at an exhaust unit 15, which is connected to a scrubber not illustrated.

Inside the reaction chamber 11, a carbon susceptor 16 is disposed for supporting a substrate 2 on which a deposition is carried out, and a radio-frequency coil 17 is provided so as to surround the reactor 12 for energizing the susceptor 16. The temperature of the substrate 2 is measured by a thermocouple 18 provided in the susceptor 16 in the vicinity of the substrate 2.

Figure 4B:
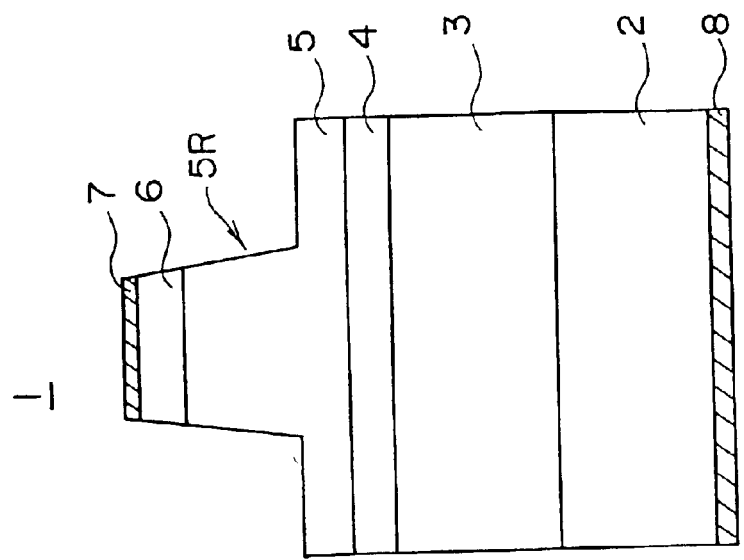
FIGS. 4A and 4B are diagrams showing the construction of a ridge-waveguide laser diode according to a first embodiment of the present invention respectively in a longitudinal cross-sectional view and an end view.
Figure 4A:
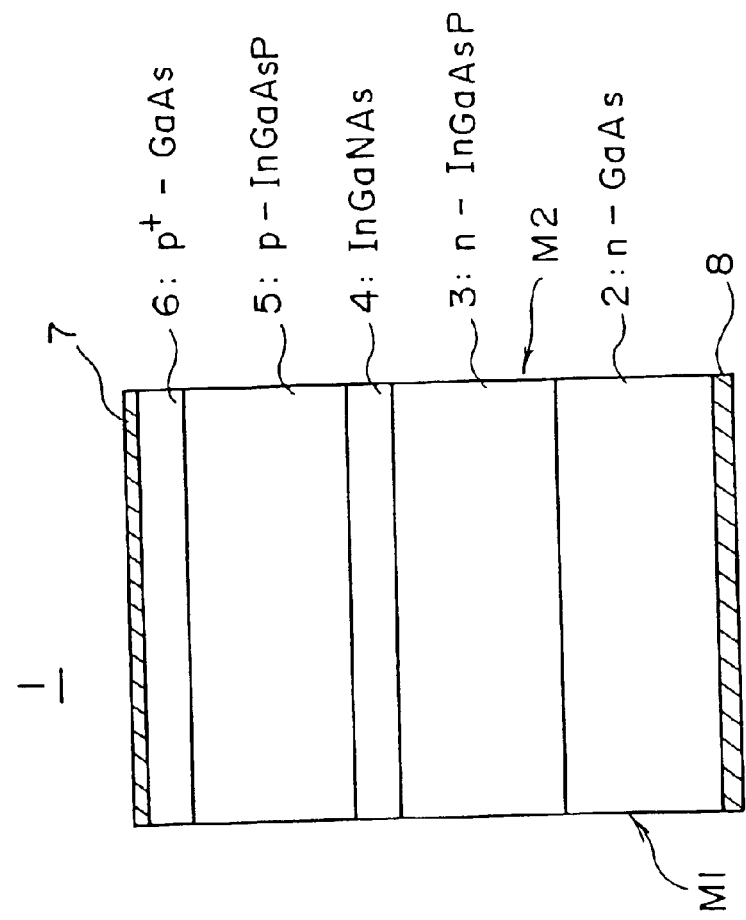

FIGS. 4A and 4B show the construction of a double-hetero laser diode 1 according to a first embodiment of the present invention fabricated by the deposition apparatus 10 respectively in a longitudinal cross sectional view and an end view.

Referring to FIGS. 4A and 4B, the laser diode 1 includes a substrate 2 of n-type GaAs on which a lower cladding layer 3 of n-type GaInP is provided epitaxially with a thickness of typically about 1500 nm. It should be noted that the lower cladding layer 3 is substantially free from Al, and the deposition of the lower cladding layer 3 is carried out in the deposition chamber 11 of FIG. 3 at a substrate temperature of 450–700° C. while supplying TMG (trimethylgallium) or TEG (triethylgallium) as the source of Ga, TMI (trimethylindium) or TEI (triethylindium) as the source of In, $AsH_3$ as the source of As and $PH_3$ as the source of P, together with a carrier gas of $H_2$. During the deposition of the lower cladding layer, an n-type dopant such as Si or Se is added to the foregoing source gases in the form of $SiH_4$ or $H_2Se$. In a typical example, the lower cladding layer 3 has a composition of $Ga_{0.5}In_{0.5}P$ and a bandgap of 1.91 eV, wherein the composition of the lower cladding layer 3 is set so as to establish a lattice matching to the GaAs substrate 1. Thereby, the cladding layer 3 can be grown to the foregoing thickness without creating dislocations caused as a result of lattice misfit between the cladding layer 3 and the substrate 2.

After the lower cladding layer 3 is thus formed, an active layer 4 of undoped GaInNAs having a composition of approximately $Ga_{0.9}In_{0.1}N_{0.03}As_{0.97}$ is grown epitaxially on the lower cladding layer 3 at a temperature of about 450–700° C., while supplying TMG, TMI, $AsH_3$ and dimethylhydradine (DMHy), an organic nitride compound, respectively as the sources of Ga, In, As and N. The deposition may be conducted by setting the flow rates of TMG, TMI, $AsH_3$ and DMHy to $4.0\times10^{-6}$–$4.0\times10^{-5}$ mol/min, $4.4\times10^{-7}$–$4.4\times10^{-6}$ mol/min, $6.0\times10^{-5}$–$2.2\times10^{-3}$ mol/min (0.4–46.4 SCCM) and $5.0\times10^{-4}$ mol/min, respectively. The total flowrate including the carrier gas may be set to 6 l/min, and the $AsH_3$ partial pressure in the reaction chamber 11 is set to 0.9–102 Pa. The total pressure in the reaction chamber is set to about $1.3\times10^4$ Pa. It should be noted that DMHy is used commonly as a CVD source of N when growing a SiN film. Further, it is also possible to use materials such as monomethylhydradine (MMHy) or TBA (tertiarybutylamine) for the source of N.

In a preferable example, the flow rate of TMG is set to about $2.0\times10^{-5}$ mol/min, the flow rate of TMI is set to about $2.2\times10^{-6}$ mol/min, the flow rate of $AsH_3$ is set to about $3.3\times10^{-4}$ mol/min or 7 sccm, and the flowrate of DMHy is set to about $6.4\times10^{-3}$ mol/min, and the deposition is carried out at a substrate temperature of about 630° C. under a pressure of about 15.4 Pa, which is almost identical to the partial pressure of $AsH_3$ in the reaction chamber 11. Under the foregoing deposition condition, the active layer 4 having a composition of $Ga_{0.9}In_{0.1}N_{0.03}As_{0.97}$ is grown with a growth rate of about 1.7 $\mu$m/H.

It should be noted that the foregoing composition of $Ga_{0.9}In_{0.1}N_{0.03}As_{0.97}$ of the active layer 4 successfully achieves a lattice matching to the GaAs substrate 2. Thus, it is possible in the present embodiment to form the active layer 4 with an increased thickness of about 100 nm, without inducing dislocations as a result of lattice misfit between the active layer 4 and the substrate 2.

Once the active layer 4 is thus formed, an upper cladding layer 5 of InGaAsP is grown thereon similarly to the case of forming the lower cladding layer 3, except that a p-type dopant gas such as dimethylzinc $((CH)_{32}Zn)$ is added in place of the n-type dopant gas noted previously. Further, a cap layer 6 of $p^+$-type GaAs is grown on the upper cladding layer 5, and the cap layer 6 and the underlying cladding layer 5 are subjected to an etching process to form a ridge structure 5R extending in the axial direction of the laser diode. In order to stop the etching of the upper cladding layer 5 before the active layer 4 is exposed, it may be preferable to interpose a thin etching stopper layer of p-type GaInP (not shown) inside the cladding layer 5.

After the ridge structure 5R is thus formed, a p-type ohmic electrode 7 having an AuZn/Zn stacked structure is provided on the cap layer 6, and an n-type ohmic electrode 8 having an AuGe/Ni/Au stacked structure is provided on the lower major surface of the substrate 2.

In the longitudinal cross sectional view of the laser diode 1 of FIG. 4A, it should be noted that an optical cavity is formed between a front cleaved surface M1 acting as a first mirror and a rear cleaved surface M2 acting as a second, opposing mirror as usual in an edge-emission type laser diode. Further, the laser diode 1 has a so-called double-hetero structure in which the active layer 4, having a substantial thickness, acts also as an optical waveguide layer.

FIG. 5 shows a room-temperature oscillation spectrum of the laser diode 1 of FIGS. 4A and 4B for a case in which the stripe structure 5R has a width of about 2 μm. Referring to FIG. 5, it will be noted that the laser diode oscillates in the optical wavelength of 1293 nm, which is well inside the desired 1.3 μm wavelength band (1.25–1.35 μm). This result is in good agreement with the result,of photoluminescent (PL) spectroscopy conducted on the GaInNAs mixed crystal by illuminating the GaInNAs mixed crystal by a laser beam of an Ar laser having a wavelength of 448 nm.

The result of FIG. 5 indicates that the problem of non-optical recombination of carriers explained previously is successfully avoided as a result of use of the Al-free composition for the cladding layers 3 and 5. As the cladding layers 3 and 5 are substantially free from Al, no problem of oxidation occurs even when the deposition of the cladding layer 3 or 5 is conducted at a relatively low temperature as noted above or when the substrate temperature is lowered in preparation for the deposition of the GaInNAs active layer 4 on the pre-existing lower cladding layer 3. Thereby, the laser diode 10 thus obtained is characterized by a high efficiency of laser oscillation and has a long lifetime.

Figure 1:
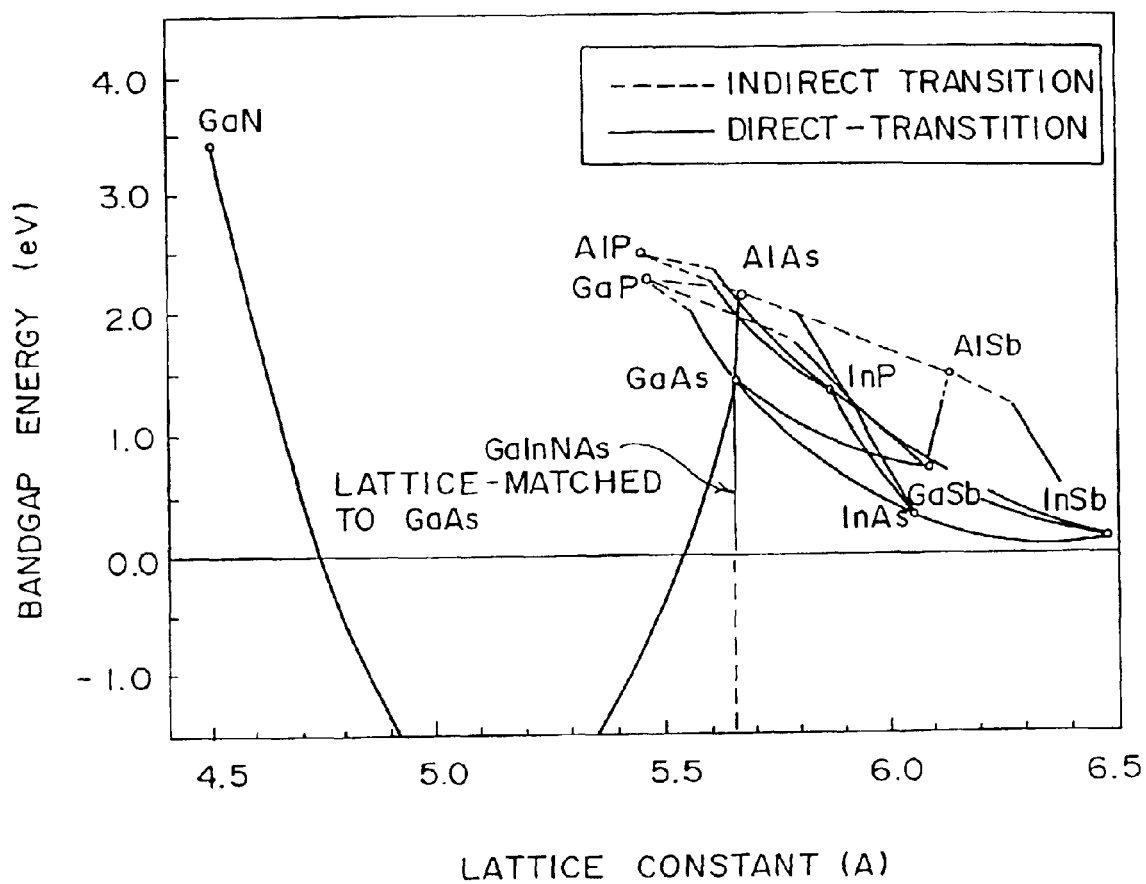
FIG. 1 is a diagram showing the bandgap energy of various group III–V compound semiconductor systems.
Figure 2:
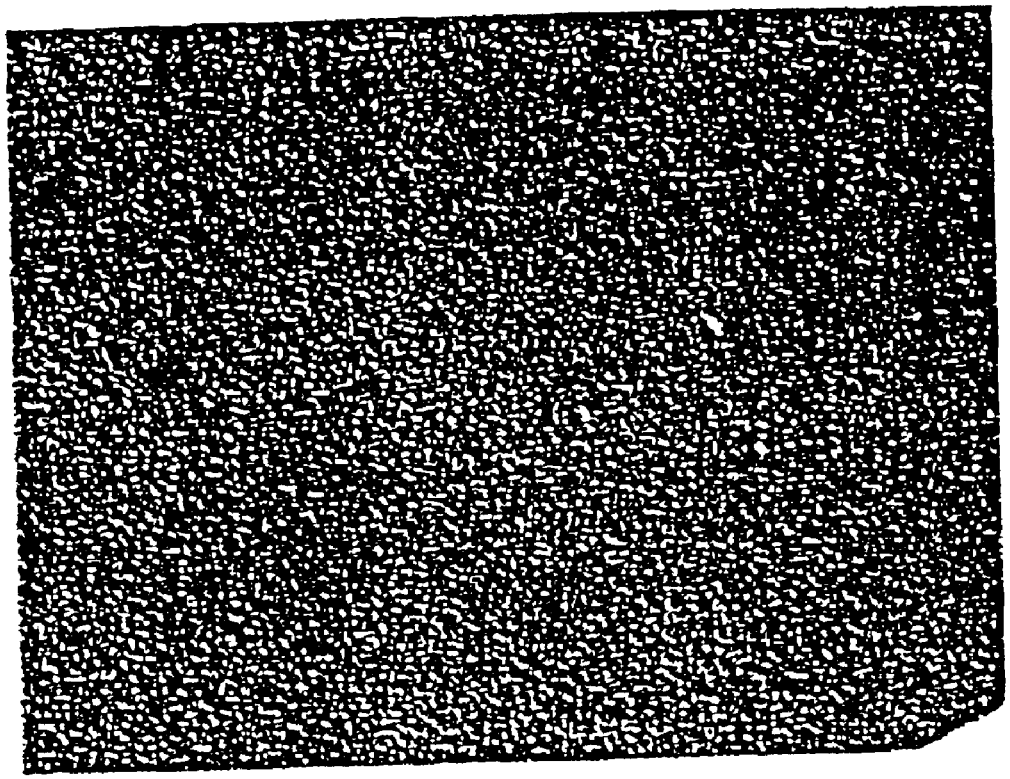
FIG. 2 is a diagram showing a rough surface morphology obtained for a GaInNAs layer grown directly on an AlGaAs layer.

It should be noted that the composition of the GaInNAs active layer 4 that establishes a lattice matching to the GaAs substrate 2 is by no means limited to the foregoing specific composition but other compositions are also possible. For example, a composition of $Ga_{0.94}In_{0.06}N_{0.02}As_{0.98}$ provides also a successful lattice matching to the GaAs substrate and a bandgap smaller than the bandgap of GaAs. Generally, the lattice constant of the GaInNAs mixed crystal increases with increasing In content and decreases with increasing N content. Further, the bandgap decreases with increasing N content and/or increasing In content. See the relationship of FIG. 1.

Figure 6:
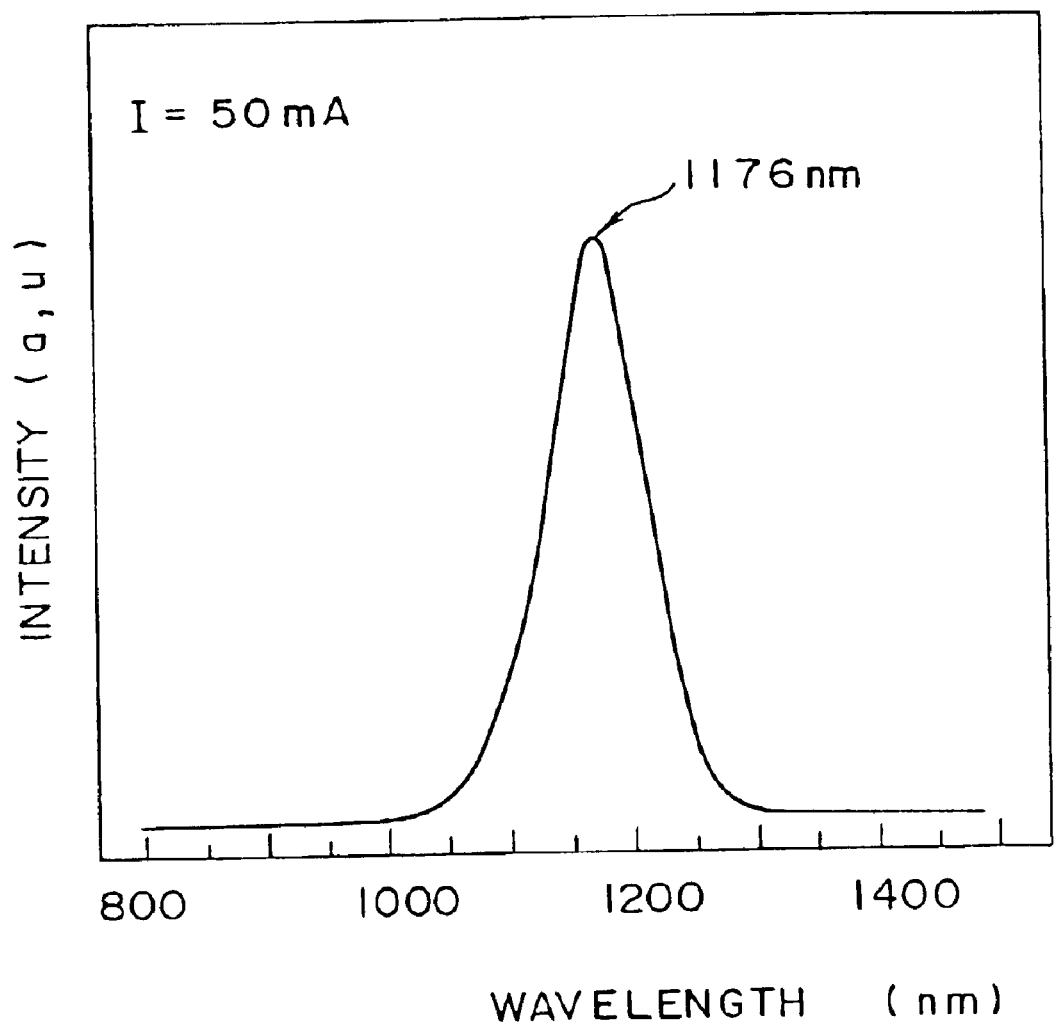
FIG. 6 is a diagram showing an optical emission spectrum of an active layer composition used in the laser diode of the first embodiment.

Thus, the foregoing second composition, $Ga_{0.94}In_{0.06}N_{0.02}As_{0.98}$, provides a photon emission at the wavelength of 1176 nm as indicated in FIG. 6, wherein FIG. 6 shows an optical output spectrum of the laser diode of FIGS. 4A and 4B in which the foregoing second composition is used for the GaInNAs active layer 4. It should be noted that the result of FIG. 6 is for the case in which the laser diode is operated as an LED by supplying a drive current of 50 mA.

It should be noted that the foregoing second composition, providing an increased bandgap, can be used also for the cladding layers 3 and 5. In this case, the composition of the GaInNPAs cladding layer, generally represented as $Ga_dIn_{1-d}N_eAs_fP_{1-e-f}$ ($0 \leq d \leq 1$, $0 \leq e < 1$, $0 \leq f \leq 1$), is adjusted such that the lattice matching is achieved to the GaAs substrate 2 and such that the bandgap is maximized. As long as Al is not contained in the cladding layer 3 or 5, no substantial problem occurs when growing the active layer 4 on the substrate 2.

Further, it should be noted that the active layer 4 of GaInNAs may further contain P in addition to Ga, In, N and As. In this case, the composition of the active layer 4 is generally represented as $Ga_aIn_{1-a}N_bAs_cP_{1-b-c}$ ($0 \leq a \leq 1$, $0 < b < 1$, $0 \leq c < 1$), wherein it should be noted that the bandgap of the active layer 4 tends to increase with increasing P content in the mixed crystal.

[Second Embodiment]

Figure 7:
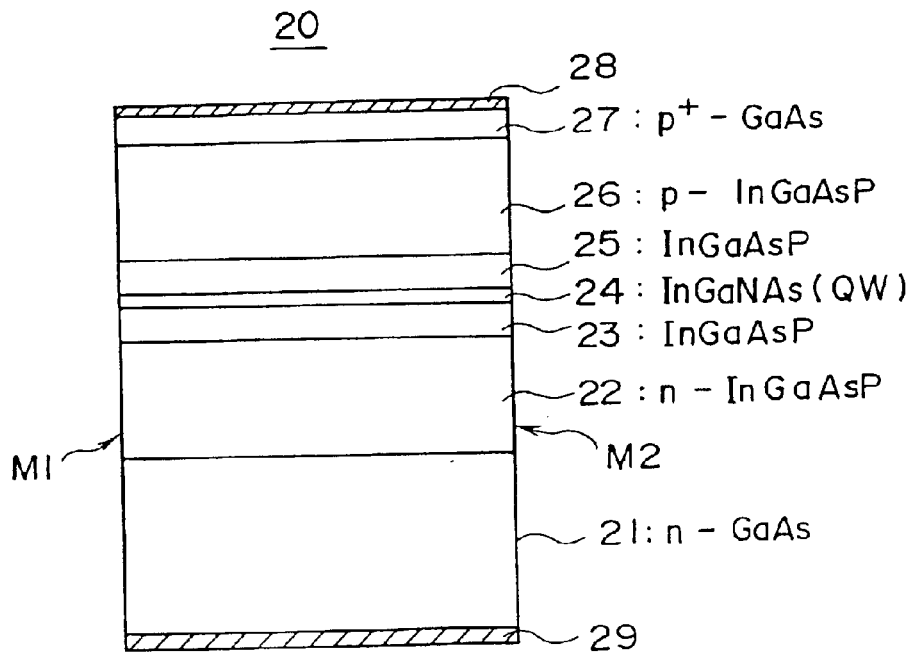
FIG. 7 is a diagram showing the construction of a laser diode according to a second embodiment of the present invention in a longitudinal cross-sectional view.

FIG. 7 shows the construction of a laser diode 20 according to a second embodiment of the present invention in a longitudinal cross sectional view.

Referring to FIG. 7, the laser diode 20 has a so-called SCH-SQW (separate confinement hetero-structure single quantum well) structure and constructed on a substrate 21 of n-type GaAs on which a lower cladding layer 22 of n-type GaInPAs is provided epitaxially with a thickness of typically about 1500 nm. The lower cladding layer establishes a lattice matching with the GaAs substrate 21 and may have a composition of $Ga_{0.57}In_{0.43}P_{0.85}As_{0.15}$ and a bandgap energy of 1.85 eV.

On the lower cladding layer 22, a lower optical waveguide layer 23 of undoped GaInPAs having a composition of $Ga_{0.87}In_{0.13}P_{0.25}As_{0.75}$ and a bandgap energy of 1.53 eV is provided epitaxially with a thickness of 100 nm in lattice matching to the substrate 21, and an active layer 24 of undoped GaInNAs having a composition of $Ga_{0.87}In_{0.13}N_{0.04}As_{0.96}$ is provided further on the optical waveguide layer 23 with a thickness of about 20 nm or less, also in lattice matching to the GaAs substrate 21. Further, an upper optical waveguide layer 25 of GaInAsP is provided on the active layer 24 similarly to the lower optical waveguide layer 23 with a composition of $Ga_{0.39}In_{0.13}P_{0.25}As_{0.75}$ and a thickness of 100 nm in lattice matching to the GaAs substrate 21, and an upper cladding layer 26 of p-type GaInAsP is provided on the upper optical waveguide layer 25 with a thickness of typically about 1.5 μm in lattice matching to the GaAs substrate 21. Thereby, it should be noted that the active layer 24 forms a quantum well.

Further, a cap layer 27 of p$^+$-type GaAs is provided on the upper cladding layer 26, and an upper ohmic electrode 28 having the AuZn/Zn stacked structure is provided on the cap layer 27. Further, a lower ohmic electrode 29 having the AuGe/Ni/Au stacked structure is provided on the lower major surface of the substrate 21.

Similarly to the laser diode 1 of FIG. 4A, the laser diode 20 is defined in the longitudinal or axial direction thereof by cleaved surfaces M1 and M2 that form an optical cavity. Further, the deposition of the layers 22–27 may be made in the deposition apparatus of FIG. 3 similarly to the process of forming the layers 2–6 of FIGS. 4A and 4B.

In the present embodiment, the active layer 24 emits, when in a bulk crystal state, an optical radiation having a wavelength longer than the desired 1.3 μm band because of the increased In content in the active layer 24. However, the oscillation wavelength of the laser diode is successfully controlled to the desired wavelength of about 1.3 μm by reducing the thickness of the active layer 24 to about 20 nm or less, such that quantum levels are formed in the active layer 24 with appropriate energy separation between the quantum levels. Of course, the composition of the active layer 24 is not limited to the foregoing composition but other compositions, including those that do not achieve lattice matching, may be used. As long as the thickness of the active layer 24 is within a critical thickness, the development of dislocations in the active layer 24 is successfully avoided. Further, the optical waveguide layers 23 and 25 may have a composition that does not provide a lattice matching to the GaAs substrate 21, as long as the thickness is within the critical thickness of such a strained system formed of the GaAs substrate 21 and the layer 23 or 25.

In the present embodiment, too, the cladding layers 22 and 26 are substantially free from Al. Further, the upper and lower optical waveguide layers 23 and 25 are also free from Al. Thereby, the growth of the active layer 24 of GaInNAs can be conducted continuously to the process of growing the cladding layer 22 or the optical waveguide layer 23, which process is conducted at a low temperature suitable for the growth of the GaInNAs active layer 24. The laser diode 20 thus obtained is characterized by a high efficiency of laser oscillation and has a long lifetime.

Alternatively, the layers 22 and 23 may be formed at a high temperature. In this case, the substrate temperature is lowered before the deposition of the active layer 24 is commenced. Even in such a case, the problem of oxidation does not occur, as any of the cladding layer 22 and the guide layer 23 is substantially free from Al.

Further, it should be noted that, in view of the Al-free composition of the lower and upper cladding layers 22 and 26, it is possible to form the optical waveguide layers 23 and 25 by a mixed crystal of GaInNPAs. In this case, the composition $Ga_dIn_{1-d}N_eAs_fP_{1-e-f}$ ($0 \leq d \leq 1$, $0 \leq e < 1$, $0 \leq f \leq 1$) of the mixed crystal is appropriately adjusted such that the bandgap of the optical waveguide layers 23 and 25 is smaller than the bandgap of the cladding layers 22 and 26. For example, the composition of $Ga_{0.97}In_{0.03}N_{0.01}As_{0.99}$ may be used for the optical waveguide layers 23 and 25 in combination with the composition of $Ga_{0.5}In_{0.5}P$ for the cladding layers 22 and 26.

In the present embodiment, it should be noted that the active layer 24 may be provided with plural numbers, with intervening barrier layers of GaInNPAs or GaInPAs. In this case, the composition of the barrier layers is set such that the bandgap is larger than the bandgap of the active layers 24 but smaller than the cladding layers 22 and 26.

[Third Embodiment]

Figure 8:
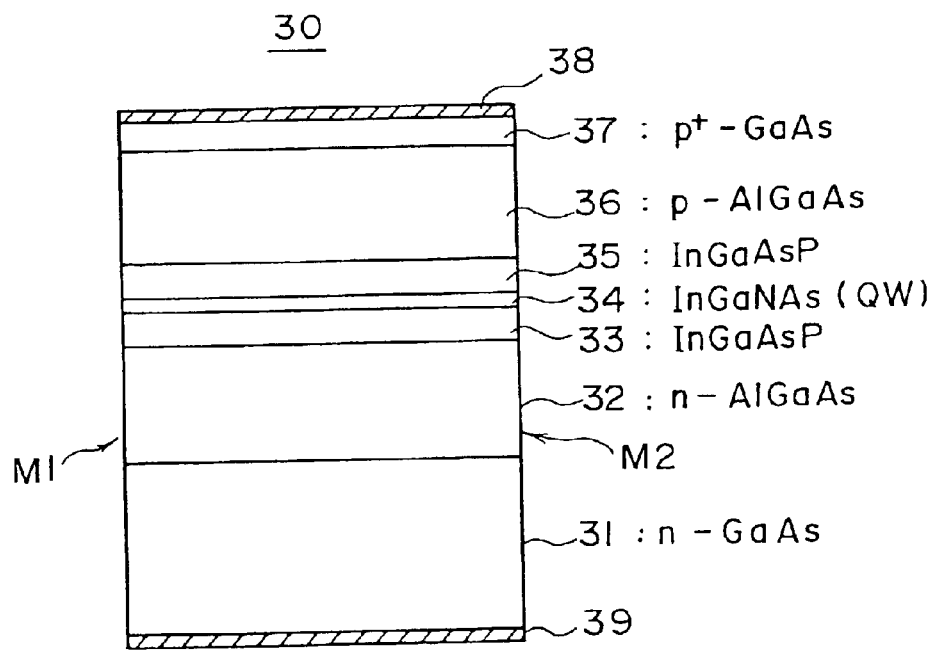
FIG. 8 is a diagram showing the construction of a laser diode according to a third embodiment of the present invention in a longitudinal cross-sectional view.

FIG. 8 shows the construction of a laser diode 30 according to a third embodiment of the present invention in a longitudinal cross sectional view.

Referring to FIG. 8, the laser diode 30 is a SCH-SQW type laser diode similar to the laser diode 20 of FIG. 7 and is constructed on a substrate 31 of n-type GaAs on which a lower cladding layer 32 of n-type AlGaAs is provided epitaxially with a thickness of typically about 1500 nm. The lower cladding layer 32 establishes a satisfactory lattice matching to the GaAs substrate 31 and may have a composition of $Al_{0.8}Ga_{0.2}As$.

On the lower cladding layer 32, a lower optical waveguide layer 33 of undoped GaInPAs having a composition of $Ga_{0.87}In_{0.13}P_{0.25}As_{0.75}$ and a bandgap energy of 1.53 eV is provided epitaxially with a thickness of 100 nm in lattice matching to the substrate 31, and an active layer 34 of undoped GaInNAs having a composition of $Ga_{0.87}In_{0.13}N_{0.04}As_{0.96}$ is provided further on the optical waveguide layer 33 with a thickness of about 20 nm or less, also in lattice matching to the GaAs substrate 31. Further, an upper optical waveguide layer 35 of GaInAsP is provided on the active layer 34 similarly to the lower optical waveguide layer 33 with a composition of $Ga_{0.87}In_{0.13}P_{0.25}As_{0.75}$ and a thickness of 100 nm in lattice matching to the GaAs substrate 31, and an upper cladding layer 36 of p-type AlGaAs is provided on the upper optical waveguide layer 35 with a thickness of typically about 1500 nm in lattice matching to the GaAs substrate 31. Thereby, it should be noted that the active layer 34 forms a quantum well. The optical waveguide layers 33 and 35 may have a bandgap energy of 1.53 eV as noted already.

Further, a cap layer 37 of $p^+$-type GaAs is provided on the upper cladding layer 36, and an upper ohmic electrode 38 having the AuZn/Zn stacked structure is provided on the cap layer 37. Further, a lower ohmic electrode 39 having the AuGe/Ni/Au stacked structure is provided on the lower major surface of the substrate 31.

Similarly to the laser diode 1 of FIG. 4A, the laser diode 30 is defined in the longitudinal or axial direction thereof by cleaved surfaces M1 and M2 that form an optical cavity.

Further, the deposition of the layers 32–37 may be made in the deposition apparatus of FIG. 3 similarly to the process of forming the layers 2–6 of FIGS. 4A and 4B.

In the present embodiment, too, it should be noted that the layers 33 and 35 that contact directly to the active layer 34 is free from Al. Thus, the problem of formation of non-optical recombination centers on the surface of the active layer 34 as a result of oxidation of Al is effectively avoided. Thereby, an efficient laser diode having a long lifetime is obtained.

Further, it should be noted that the cladding layers 32 and 36, now formed of AlGaAs, has a low thermal resistance, which is about one-half the thermal resistance of InGaP. In view of the large thickness of the upper and lower cladding layers 32 and 36, the use of AlGaAs for the cladding layers 32 and 36 is advantageous for suppressing the temperature rise in the active layer 34 during the operation of the laser diode. Further, the use of AlGaAs, having a low refractive index and a very large bandgap, for the cladding layers 32 and 36, is advantageous for enhancing the optical confinement of the optical radiation produced by the active layer 34 and the confinement of carriers injected to the active layer 34.

Similarly to the laser diode 20 of FIG. 7, the active layer 34 may have a composition different from the composition noted above, including the composition that does not achieve a lattice matching to the GaAs substrate 31, provided that the thickness of the active layer 34 does not exceed a critical thickness of the strained system formed of the active layer 34 and the substrate 31. Similarly, the active layer 34 may be a mixed crystal of GaInNPAs that contains P, wherein the optical waveguide layers 33 and 35 of GaInPAs may have a composition $In_xGa_{1-x}As_yP_{1-y}$ ($0 \leq x < 1$, $0 \leq y \leq 1$) that does not achieve a lattice matching to the GaAs substrate 31, provided that the thickness of the layers 33 and 35 is smaller than a critical thickness of such a strained system formed by the substrate 31 and the layer 33 or 35. The cladding layers 32 and 36 of AlGaAs may have a composition different from the foregoing composition of $Al_{0.8}Ga_{0.2}As$ as long as the conduction band energy is larger than the conduction band energy of the guide layers 33 and 35.

[Fourth Embodiment]

Figure 9:
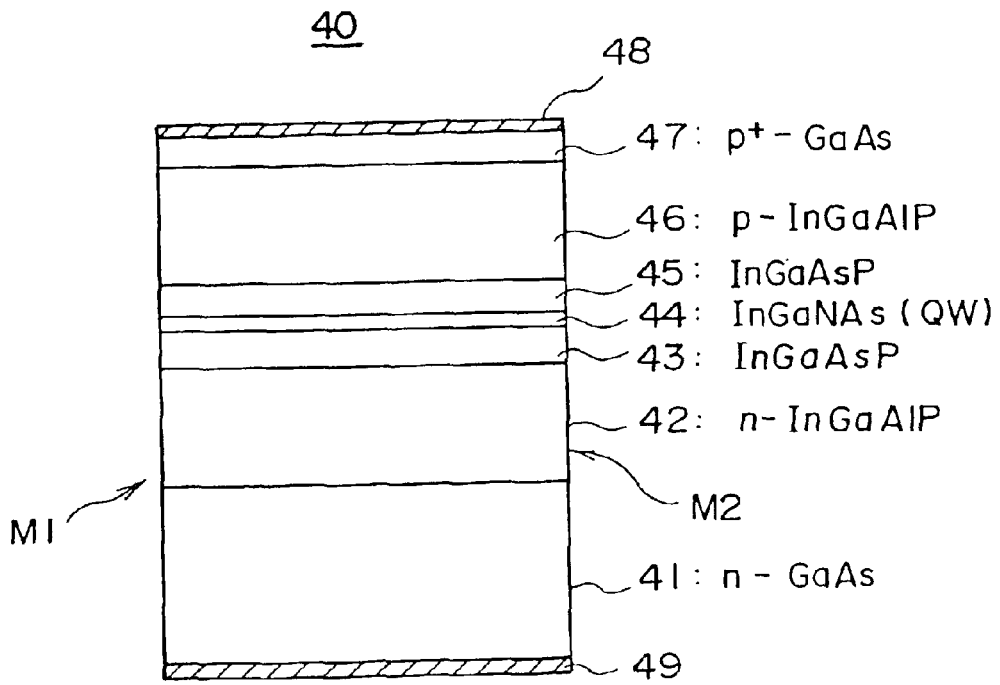
FIG. 9 is a diagram showing the construction of a laser diode according to a fourth embodiment of the present invention in a longitudinal cross-sectional view.

FIG. 9 shows the construction of a laser diode 40 according to a fourth embodiment of the present invention in a longitudinal cross sectional view.

Referring to FIG. 9, the laser diode 40 is a SCH-SQW type laser diode similar to the laser diode 20 of FIG. 7 and is constructed on a substrate 41 of n-type GaAs on which a lower cladding layer 42 of n-type AlGaInP is provided epitaxially with a thickness of typically about 1500 nm. The lower cladding layer 42 establishes a satisfactory lattice matching with the GaAs substrate 41 and may have a composition of $Al_{0.35}Ga_{0.15}In_{0.5}P$.

On the lower cladding layer 42, a lower optical waveguide layer 43 of undoped GaInPAs having a composition of $Ga_{0.87}In_{0.13}P_{0.25}As_{0.75}$ is provided epitaxially with a thickness of 7 nm in lattice matching to the substrate 41, and an active layer 44 of undoped GaInNAs having a composition of $Ga_{0.87}In_{0.13}N_{0.04}As_{0.96}$ is provided further on the optical waveguide layer 43 with a thickness of about 20 nm or less, also in lattice matching to the GaAs substrate 41. Further, an upper optical waveguide layer 45 of GaInAsP is provided on the active layer 44 similarly to the lower optical waveguide layer 43 with a composition of $Ga_{0.87}In_{0.13}P_{0.25}As_{0.75}$ and a thickness of 100 nm in lattice matching to the GaAs substrate 41, and an upper cladding layer 46 of p-type AlGaInP is provided on the upper optical waveguide layer 45 with a thickness of typically about 1500 nm in lattice matching to the GaAs substrate 41. Thereby, it should be noted that the active layer 44 forms a quantum well.

Further, a cap layer 47 of p+-type GaAs is provided on the upper cladding layer 46, and an upper ohmic electrode 48 having the AuZn/Zn stacked structure is provided on the cap layer 47. Further, a lower ohmic electrode 49 having the AuGe/Ni/Au stacked structure is provided on the lower major surface of the substrate 41.

Similarly to the laser diode 1 of FIG. 4A, the laser diode 40 is defined in the longitudinal or axial direction thereof by cleaved surfaces M1 and M2 that form an optical cavity. Further, the deposition of the layers 42–47 may be made in the deposition apparatus of FIG. 3 similarly to the process of forming the layers 2–6 of FIGS. 4A and 4B.

In the present embodiment, too, it should be noted that the layers 43 and 45 that contact directly to the active layer 44 is free from Al. Thus, the problem of formation of non-optical recombination centers on the surface of the active layer 44 as a result of oxidation of Al is effectively avoided. Thereby, an efficient laser diode having a long lifetime is obtained.

Further, the use of AlGaInP, having a very large bandgap even larger than the bandgap of AlGaAs, for the cladding layers 42 and 46, is advantageous for maximizing the optical confinement of the optical radiation produced by the active layer 44 and for maximizing simultaneously the confinement of carriers in the active layer 44. In addition, it should be noted that, by using AlGaInP for the cladding layers 42 and 46, it becomes possible to achieve a perfect lattice matching to the GaAs substrate 41, contrary to the case of the laser diode 30 of FIG. 8 that uses AlGaAs for the cladding layers 32 and 36. When AlGaAs is used, the lattice misfit strain is not completely eliminated.

[Fifth Embodiment]

Figure 10:
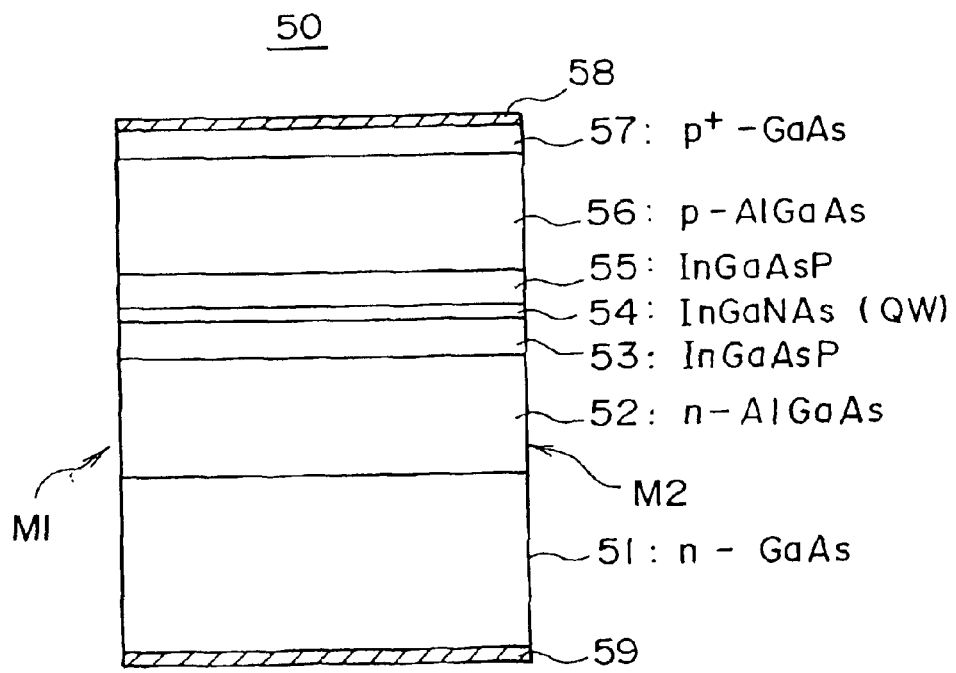
FIG. 10 is a diagram showing the construction of a laser diode according to a fifth embodiment of the present invention in a longitudinal cross-sectional view.

FIG. 10 shows the construction of a laser diode 50 according to a fifth embodiment of the present invention in a longitudinal cross sectional view.

Referring to FIG. 10, the laser diode 50 is a SCH-SQW type laser diode similar to the laser diode 30 of FIG. 8 and is constructed on a substrate 51 of n-type GaAs on which a lower cladding layer 52 of n-type AlGaAs is provided epitaxially with a thickness of typically about 1500 nm. The lower cladding layer establishes a satisfactory lattice matching with the GaAs substrate 51 and may have a composition of $Al_{0.8}Ga_{0.2}As$.

On the lower cladding layer 52, a lower optical waveguide layer 53 of undoped GaInPAs having a composition of $Ga_{0.87}In_{0.13}P_{0.25}As_{0.75}$ is provided epitaxially with a thickness of 100 nm in lattice matching to the substrate 51, and an active layer 54 of undoped GaInNAs having a composition of $Ga_{0.8}In_{0.2}N_{0.02}As_{0.98}$ is provided further on the optical waveguide layer 53 with a thickness of about 20 nm or less, also in lattice matching to the GaAs substrate 51. Further, an upper optical waveguide layer 55 of GaInAsP is provided on the active layer 54 similarly to the lower optical waveguide layer 53 with a composition of $Ga_{0.87}In_{0.13}P_{0.25}As_{0.98}$ and a thickness of 100 nm in lattice matching to the GaAs substrate 51, and an upper cladding layer 56 of p-type AlGaAs is provided on the upper optical waveguide layer 55 with a thickness of typically about 1500 nm in lattice matching to the GaAs substrate 51. Thereby, it should be noted that the active layer 54 forms a quantum well similar to the quantum well 34. The optical waveguide layers 53 and 55 may have a bandgap of 1.53 eV.

Further, a cap layer 57 of p+-type GaAs is provided on the upper cladding layer 56, and an upper ohmic electrode 38 having the AuZn/Zn stacked structure is provided on the cap layer 57. Further, a lower ohmic electrode 59 having the AuGe/Ni/Au stacked structure is provided on the lower major surface of the substrate 51.

Similarly to the laser diode 1 of FIG. 4A, the laser diode 50 is defined in the longitudinal or axial direction thereof by cleaved surfaces M1 and M2 that form an optical cavity. Further, the deposition of the layers 52–57 may be made in the deposition apparatus of FIG. 3 similarly to the process of forming the layers 2–6 of FIGS. 4A and 4B.

In the foregoing structure, it should be noted that the cladding layer 52 or 56 containing therein Al does not contact to the active layer 54 that contains N therein. Thereby, the problem of oxidation of Al in the cladding layer 52 or 56 at the time of the formation of the active layer 54 is successfully avoided.

In the present embodiment, the active layer 54 has a composition of $Ga_{0.8}In_{0.2}N_{0.02}As_{0.98}$, in which it will be noted that the In content of the active layer 54 exceeds the foregoing lattice matched composition of $Ga_{0.87}In_{0.13}N_{0.04}As_{0.96}$ of the active layer 34 of the laser diode 30 substantially, while the N content is reduced substantially as compared with the foregoing, lattice matched composition. As a result of the increased In content, the GaInNAs mixed crystal forming the active layer 54 has a lattice constant substantially larger than the lattice constant of GaAs. Thereby, the active layer 54 accumulates therein a compressive lattice misfit strain, while such a compressive lattice misfit strain acts to decrease the bandgap of the GaInNAs mixed crystal forming the active layer 54, and the oscillation wavelength of the laser diode 50 is successfully tuned to the 1.3 μm wavelength band by decreasing the N content correspondingly.

Thus, by using the GaInNAs mixed crystal thus accumulating a compressive lattice misfit strain for the active layer 54, it is possible to reduce the amount of N to be incorporated into the active layer 54 for use in the laser diode operable in the 1.3 μm wavelength band. It should be noted that the quality of the GaInNAs mixed crystal deteriorates rapidly with increasing N content, while the active layer 54, containing therein only a small amount of N, provides a sharp oscillation spectrum, reflecting the excellent quality of the crystal forming the active layer 54. Further, the use of a strained quantum well for the active layer 54 reduces the threshold current of laser oscillation.

[Sixth Embodiment]

Figure 11:
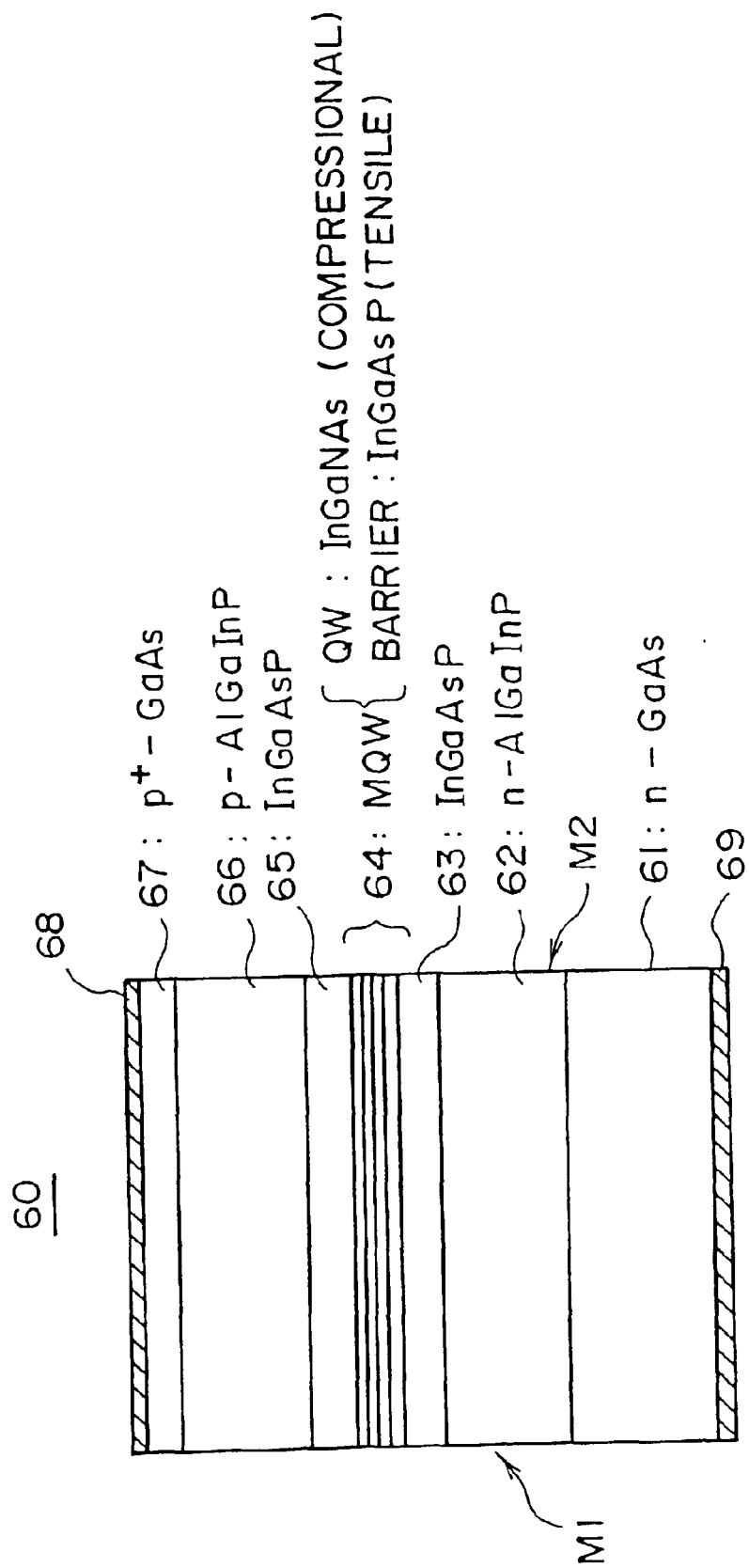
FIG. 11 is a diagram showing the construction of a laser diode according to a sixth embodiment of the present invention in a longitudinal cross-sectional view.

FIG. 11 shows the construction of an SCH-MQW (separate confinement hetero-structure multiple quantum well) laser diode 60 according to a sixth embodiment of the present invention in a longitudinal cross sectional view.

Referring to FIG. 11, the laser diode 60 is a is constructed on a substrate 61 of n-type GaAs on which a lower cladding layer 62 of n-type AlGaInP is provided epitaxially with a thickness of typically about 1500 nm. The lower cladding layer 62 establishes a lattice matching with the GaAs substrate 61 and may have a composition of $Al_{0.35}Ga_{0.15}In_{0.5}P$.

On the lower cladding layer 62, a lower optical waveguide layer 63 of undoped GaInPAs having a composition of $Ga_{0.87}In_{0.13}P_{0.25}As_{0.75}$ is provided epitaxially with a thickness of 100 nm in lattice matching to the substrate 61, and an active layer 64 having a multiple quantum well (MQW) structure in which a quantum well layer of GaInNAs having a composition $Ga_{0.8}In_{0.2}N_{0.02}As_{0.98}$ and a barrier layer of GaInAsP having a composition $GaAs_{0.92}P_{0.08}$ are stacked alternately and repeatedly, is provided further on the optical waveguide layer 63 with a thickness of about 12 nm for the quantum well layer and a thickness of about 10 nm for the barrier layer. Thereby, the composition of the quantum well layer is set so as to accumulate a compressive lattice misfit strain therein, while the composition of the barrier layer is set so as to accumulate a tensile strain therein. The quantum well layer and the barrier layer may be repeated for 3 times. Thereby, the oscillation wavelength of the laser diode 60 is successfully tuned to the desired 1.3 $\mu$m band while reducing the N content in the quantum well layer similarly to the laser diode 50.

Further, an upper optical waveguide layer 65 of GaInAsP is provided on the active layer 64 similarly to the lower optical waveguide layer 63 with a composition of $Ga_{0.87}In_{0.13}P_{0.25}As_{0.75}$ and a thickness of 100 nm in lattice matching to the GaAs substrate 61, and an upper cladding layer 66 of p-type AlGaInP is provided on the upper optical waveguide layer 65 with a thickness of typically about 1500 nm in lattice matching to the GaAs substrate 61.

Further, a cap layer 67 of $p^+$-type GaAs is provided on the upper cladding layer 66, and an upper ohmic electrode 68 having the AuZn/Zn stacked structure is provided on the cap layer 67. Further, a lower ohmic electrode 69 having the AuGe/Ni/Au stacked structure is provided on the lower major surface of the substrate 61.

Similarly to the laser diode 1 of FIG. 4A, the laser diode 60 is defined in the longitudinal or axial direction thereof by cleaved surfaces M1 and M2 that form an optical cavity. Further, the deposition of the layers 62–67 may be made in the deposition apparatus of FIG. 3 similarly to the process of forming the layers 2–6 of FIGS. 4A and 4B.

In the foregoing structure, it should be noted that the cladding layer 62 or 66 containing therein Al does not contact to the active layer 64 that contains N therein. Thereby, the problem of oxidation of Al in the cladding layer at the time of the formation of the active layer 64 is successfully avoided.

In the present embodiment, it is possible to change the composition and hence the lattice constant of the quantum well layer and the barrier layer forming the MQW active layer as desired while maintaining the same bandgap energy. This is not possible in the system of AlGaAs, in which the lattice constant changes little even when the composition, and hence the bandgap, is changed variously. By compensating the compressive lattice misfit strain of the quantum well layers by the tensile lattice misfit strain of the barrier layers, it becomes possible to form the MQW structure by stacking the quantum well layer and the barrier layer a plurality of times.

Further, it should be noted that the compositions of the GaInNAs quantum well layer and the GaInPAs barrier layer are not limited to the foregoing specific compositions but other compositions are also possible. In relation to this, it should be noted that the compositions of the GaInNAs quantum well layer and the GaInAsP barrier layer may be set such that the quantum well layer accumulates a tensile lattice misfit strain and the barrier layer accumulates a compressive lattice misfit strain.

[Seventh Embodiment]

Figure 12:
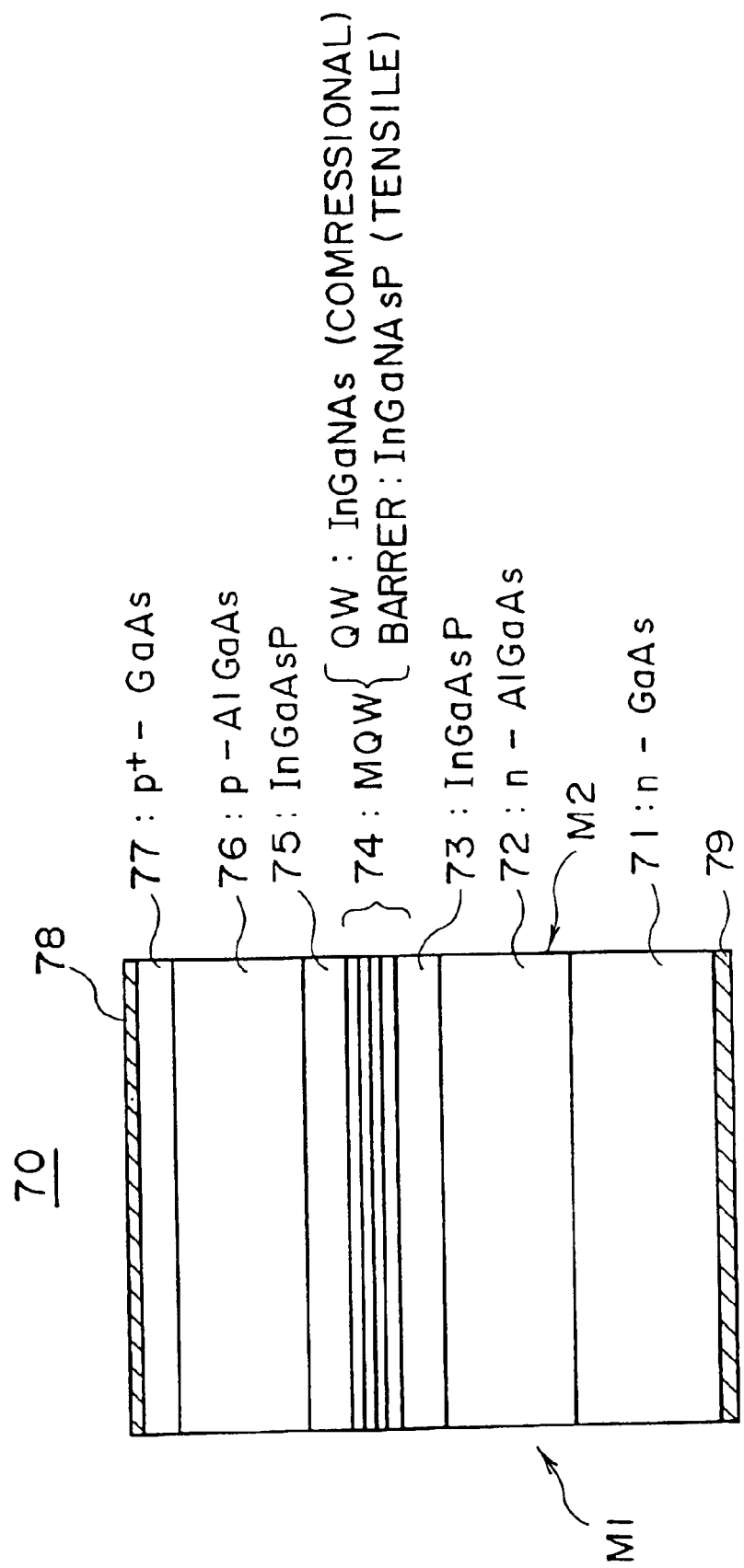
FIG. 12 is a diagram showing the construction of a laser diode according to a seventh embodiment of the present invention in a longitudinal cross-sectional view.

FIG. 12 shows the construction of a laser diode 70 according to a seventh embodiment of the present invention in a longitudinal cross sectional view.

Referring to FIG. 12, the laser diode 70 is a is constructed on a substrate 71 of n-type GaAs on which a lower cladding layer 72 of n-type AlGaInP is provided epitaxially with a thickness of typically about 1500 nm. The lower cladding layer 72 establishes a lattice matching with the GaAs substrate 71 and may have a composition of $Al_{0.35}Ga_{0.15}In_{0.5}P$.

On the lower cladding layer 72, a lower optical waveguide layer 73 of undoped GaInPAs having a composition of $Ga_{0.87}In_{0.13}P_{0.25}As_{0.75}$ is provided epitaxially with a thickness of 100 nm in lattice matching to the substrate 71, and an active layer 74 having a multiple quantum well (MQW) structure in which a quantum well having a composition $Ga_{0.8}In_{0.2}N_{0.02}As_{0.98}$ and a barrier layer having a composition $Ga_{0.8}In_{0.2}N_{0.02}P_{0.23}A_{0.75}$ are stacked alternately and repeatedly, is provided further on the optical waveguide layer 73 with a thickness of about 8 nm for the quantum well layer and a thickness of about 10 nm for the barrier layer. Thereby, the composition of the quantum well layer is set so as to accumulate a compressive lattice misfit strain therein, while the composition of the barrier layer is set so as to accumulate a tensile lattice misfit strain therein. The quantum well layer and the barrier layer may be repeated for 8 times. As a result of the compressive lattice misfit strain of the GaInNAs quantum well layers, the bandgap of the quantum well layers is reduced as compared with the nominal bandgap of the GaInNAs mixed crystal free from a lattice misfit strain. Thereby, the oscillation wavelength of the laser diode is successfully tuned to the desired 1.3 $\mu$m band.

Further, an upper optical waveguide layer 75 of GaInAsP is provided on the active layer 74 similarly to the lower optical waveguide layer 73 with a composition of $Ga_{0.87}In_{0.13}P_{0.25}As_{0.75}$ and a thickness of 100 nm in lattice matching to the GaAs substrate 71, and an upper cladding layer 76 of p-type AlGaInP is provided on the upper optical waveguide layer 75 with a thickness of typically about 1500 nm in lattice matching to the GaAs substrate 71.

Further, a cap layer 77 of $p^+$-type GaAs is provided on the upper cladding layer 76, and an upper ohmic electrode 78 having the AuZn/Zn stacked structure is provided on the cap layer 77. Further, a lower ohmic electrode 79 having the AuGe/Ni/Au stacked structure is provided on the lower major surface of the substrate 71.

Similarly to the laser diode 1 of FIG. 4A, the laser diode 70 is defined in the longitudinal or axial direction thereof by cleaved surfaces M1 and M2 that form an optical cavity. Further, the deposition of the layers 72–77 may be made in the deposition apparatus of FIG. 3 similarly to the process of forming the layers 2–6 of FIGS. 4A and 4B.

In the foregoing structure, too, it should be noted that the cladding layer 72 or 76 containing therein Al does not contact the active layer 74 that contains N therein. Thereby, the problem of oxidation of Al in the cladding layer at the time of the formation of the active layer 74 is successfully avoided.

In the present embodiment, it is possible to change the composition and hence the lattice constant of the quantum well layer and the barrier layer forming the MQW active layer 74 as desired while maintaining the same bandgap energy. This is not possible in the system of AlGaAs, in which the lattice constant changes little when the composition, and hence the bandgap, is changed variously. By compensating for the compressive lattice misfit strain of the quantum well layers by the tensile lattice misfit strain of the barrier layers, it becomes possible to form the MQW structure by stacking the quantum well layer and the barrier layer a plurality of times.

Further, it should be noted that the compositions of the GaInNAs quantum well layer and the GaInNPAs barrier layer are not limited to the foregoing specific compositions but other compositions are also possible. In relation to this, it should be noted that the compositions of the GaInNAs quantum well layer and the GaInNAsP barrier layer may be set such that the quantum well layer accumulates a tensile lattice misfit strain and the barrier layer accumulates a compressive lattice misfit strain.

In the present embodiment, it should be noted that the growth of the GaInNAsP barrier layer is carried out in the deposition apparatus of FIG. 3 similarly to the growth of GaInNAs quantum well layer, by merely adding a source of P in the form of $PH_3$, without changing the supply rate of the gaseous sources of In, Ga N and As.

Further, it should be noted that the quantum well layer in the active layer 74 may be formed of GaInNPAs, provided that the P content of the barrier layer is increased correspondingly so that an effective potential well is formed in correspondence to the quantum well layer.

[Eighth Embodiment]

Figure 13:
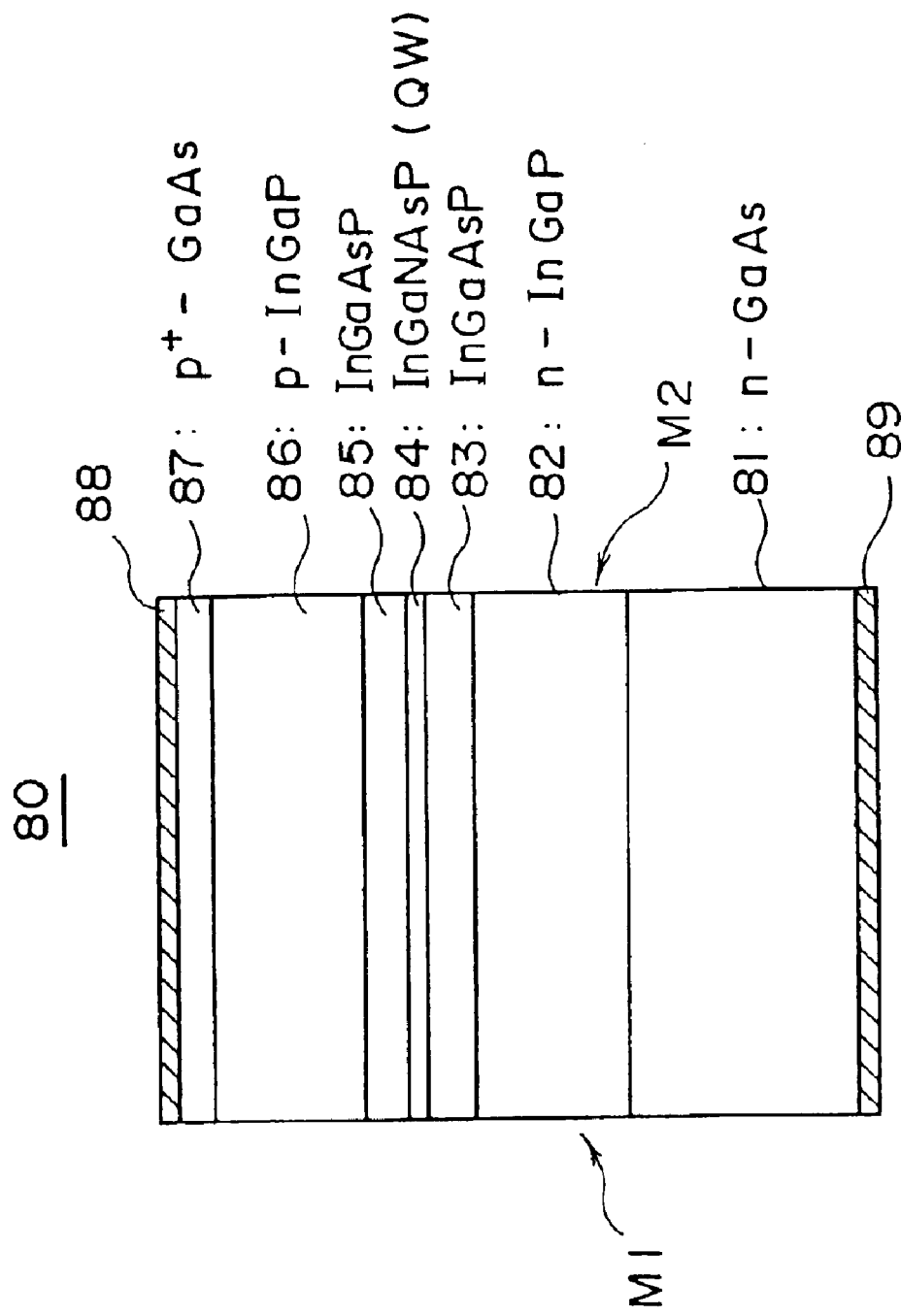
FIG. 13 is a diagram showing the construction of a laser diode according to an eighth embodiment of the present invention in a longitudinal cross-sectional view.

FIG. 13 shows the construction of a high-power double-hetero laser diode 80 according to an eighth embodiment of the present invention in a longitudinal cross sectional view. The laser diode 80 of the present embodiment is suitable for energizing a solid laser operable in a 0.8 $\mu$m wavelength band.

Referring to FIG. 13, the laser diode 80 is a is constructed on a substrate 81 of n-type GaAs on which a lower cladding layer 82 of n-type GaInP is provided epitaxially with a thickness of typically about 1500 nm. The lower cladding layer 82 establishes a lattice matching to the GaAs substrate 81 and may have a composition of $Ga_{0.51}In_{0.49}P$ and a bandgap of about 1.91 eV.

On the lower cladding layer 82, a lower optical waveguide layer 83 of undoped GaInPAs having a composition of $Ga_{0.57}In_{0.43}P_{0.85}As_{0.15}$ is provided epitaxially with a thickness of 100 nm in lattice matching to the substrate 81, and an active layer 84 having a composition of $Ga_{0.4}In_{0.6}N_{0.01}P_{0.94}As_{0.05}$ and a bandgap energy of 1.54 eV is provided further on the optical waveguide layer 83 with a thickness of about 20 nm.

Further, an upper optical waveguide layer 85 of GaInAsP is provided on the active layer 84 similarly to the lower optical waveguide layer 83 with the same composition of $Ga_{0.57}In_{0.43}P_{0.85}As_{0.15}$ with a thickness of 100 nm, in lattice matching to the GaAs substrate 81, and an upper cladding layer 86 of p-type GaInP is provided on the upper optical waveguide layer 85 with a thickness of typically about 1500 nm in lattice matching to the GaAs substrate 81, with the same composition, and hence the bandgap, to the lower cladding layer 82. The optical waveguide layers 83 and 85 may have a bandgap of 1.83 eV.

Further, a cap layer 87 of $p^+$-type GaAs is provided on the upper cladding layer 86, and an upper ohmic electrode 88 having the AuZn/Zn stacked structure is provided on the cap layer 87. Further, a lower ohmic electrode 89 having the AuGe/Ni/Au stacked structure is provided on the lower major surface of the substrate 81.

Similarly to the laser diode 1 of FIG. 4A, the laser diode 80 is defined in the longitudinal or axial direction thereof by cleaved surfaces M1 and M2 that form an optical cavity. Further, the deposition of the layers 82–87 may be made in the deposition apparatus of FIG. 3 similarly to the process of forming the layers 2–6 of FIGS. 4A and 4B.

In the foregoing structure, too, it should be noted that the cladding layer 82 or 86 is free from Al. Thereby, the problem of oxidation of Al in the cladding layer at the time of the formation of the active layer 84 is successfully avoided.

The laser diode 80 of the present embodiment has a SCH-SQW structure and oscillates at the wavelength of about 0.81 $\mu$m. As the laser diode 80 does not use AlGaAs, which is susceptible to optical damages, the laser diode 80 operates with reliability in the high-power applications such as energizing a solid laser. It should be noted that the laser diode 80, which uses GaInNAsP for the active layer 84 in combination with the cladding layers 82 and 86 of GaInP, realizes a very large band discontinuity at the conduction band as well as at the valence band, and the efficiency of laser oscillation or high-temperature stability of the laser oscillation is significantly improved.

It should be noted that the composition of the active layer 84 is not necessarily be chosen so as to establish a lattice matching to the GaAs substrate 81. The active layer 84 may have a composition that does not provide the lattice matching to the GaAs substrate 81, as long as the thickness of the active layer 84 is within a critical thickness, above which dislocations would develop in the active layer 84. Similarly, the guide layers 83 and 85 may have a composition offset from the lattice matching composition, provided that the guide layers 83 and 85 have a thickness smaller than the critical thickness of the guide layers 83 and 85.

As the cladding layers 82 and 86 are free from Al in the laser diode 80 of the present embodiment, the guide layers 83 and 85 may also contain N. Further, the active layer 84 may be provided in plural numbers to form a MQW structure.

[Ninth Embodiment]

Figure 14:
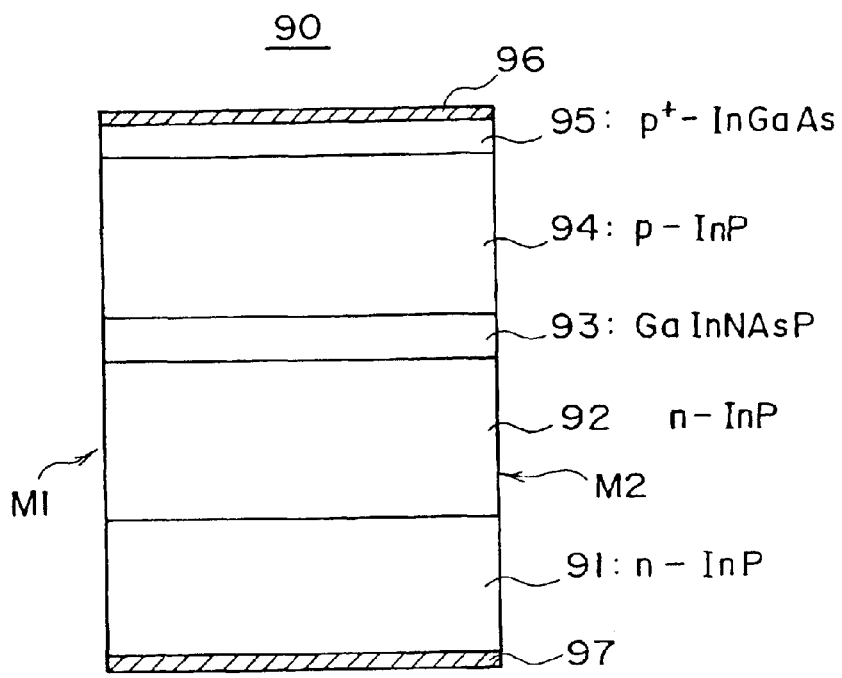
FIG. 14 is a diagram showing the construction of a laser diode according to a ninth embodiment of the present invention in a longitudinal cross-sectional view.

FIG. 14 shows the construction of a double-hetero laser diode 90 operable in the 1.4 $\mu$m wavelength band according to a ninth embodiment of the present invention in a longitudinal cross sectional view.

Referring to FIG. 14, the laser diode 90 is constructed on a substrate 91 of n-type InP on which a lower cladding layer 92 of n-type InP is provided with a thickness of typically about 1500 nm.

On the lower cladding layer 92, an active layer 93 of undoped GaInNAsP is provided with a thickness of typically about 100 nm, wherein the active layer 93 has a bandgap wavelength of 1.3 $\mu$m and establishes a lattice matching to the InP substrate 93, wherein the foregoing composition is set also such that the active layer 93 has a bandgap energy of 0.88 eV corresponding to the optical wavelength of about 1.4 $\mu$m. As the active layer 93 has a lattice matching composition as noted above, the active layer 93 can be formed with a desired thickness.

Further, the active layer 93 is covered by an upper cladding layer 94 of p-type InP, and a cap layer 95 of $p^+$-type InGaAs is provided further thereon with a thickness of 300 nm. The InGaAs cap layer 95 has a lattice matching composition of $Ga_{0.47}In_{0.53}As$.

The cap layer 95 is covered by a p-type ohmic electrode 96 having the AuZn/Zn stacked structure. Further, the lower major surface of the InP substrate 91 is covered by an n-type ohmic electrode 97 having the AuGe/Ni/Au stacked structure.

Similarly to the laser diode 1 of FIG. 4A, the laser diode 90 is defined in the longitudinal or axial direction thereof by cleaved surfaces M1 and M2 that form an optical cavity. Further, the deposition of the layers 92–95 may be made in the deposition apparatus of FIG. 3 similarly to the process of forming the layers 2–6 of FIGS. 4A and 4B.

As the active layer 97 has the bandgap corresponding to the optical wavelength of about 1.4 $\mu$m as noted before, the laser diode 90 successfully oscillates in the 1.5 $\mu$m optical wavelength band. Thereby, a large band discontinuity is secured in the conduction band at the heterojunction interface between the active layer 93 and the cladding layer 92 or 94, and the threshold current of laser oscillation is reduced substantially. In other words, the laser diode 90 shows an excellent efficiency of laser oscillation. Further, the overflowing of the carriers from the active layer 93 is successfully suppressed by the foregoing increased band discontinuity at the heterojunction interface, and the laser diode oscillates efficiently at high temperatures, without external cooling. In other words, the laser diode 90 shows an excellent temperature characteristic.

In the present embodiment, it is also possible to use a composition that is offset from a lattice matching composition, provided that the active layer 93 is formed with a thickness not exceeding a critical thickness above which dislocations develop in the active layer 93. Further, the upper and lower cladding layers 92 and 94 may be formed of GaInPAs with a general composition of $Ga_xIn_{1-x}As_yP_{1-y}$ ($0 \leq x < 1$, $0 \leq y \leq 1$), as long as a lattice matching is achieved with respect to the InP substrate 91 and as long as the cladding layers 92 and 94 have a bandgap energy larger than that of the active layer 93.

Further, the laser diode 90 can oscillate at a wavelength exceeding 1.7 μm when the composition $Ga_aIn_{1-a}N_bAs_cP_{1-b-c}$ of the active layer 93 is set such that the compositional parameter a is smaller than 0.47 and that the compositional parameters b and c satisfy the relationship of b+c=1, in other words, the active layer 93 is free from P. This oscillation wavelength has hitherto been possible only when a GaSb substrate is used, while the laser diode 90 of the present embodiment realizes the laser oscillation of this wavelength while using a low cost InP substrate.

[Tenth Embodiment]

Figure 15:
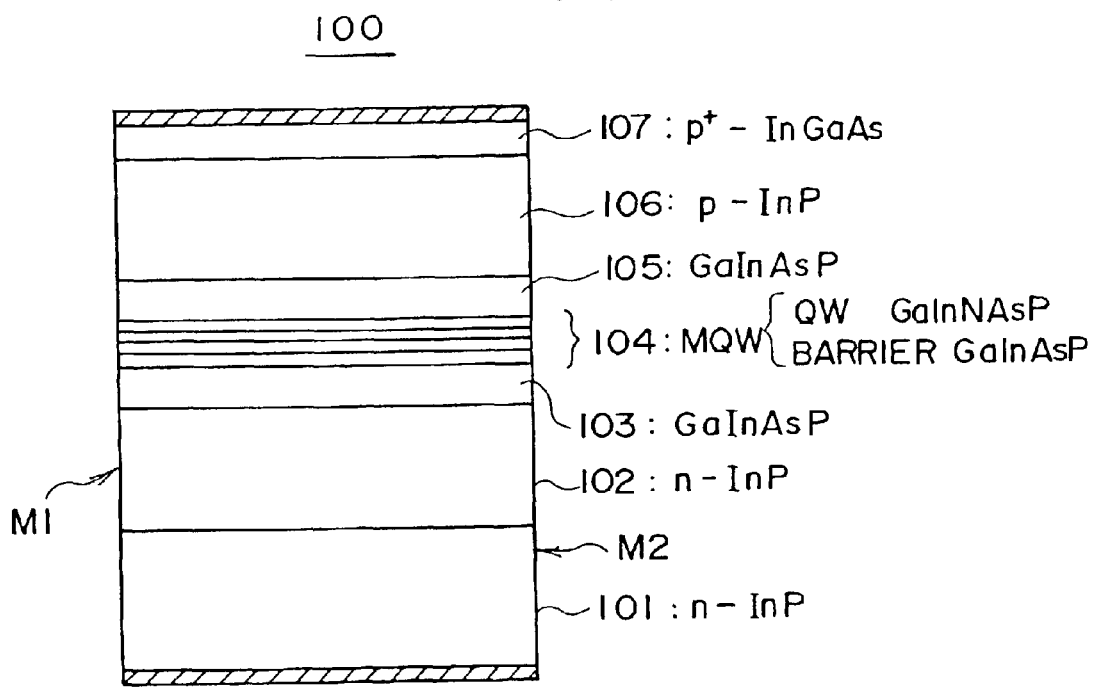
FIG. 15 is a diagram showing the construction of a laser diode according to a tenth embodiment of the present invention in a longitudinal cross-sectional view.

FIG. 15 shows the construction of an SCH-MQW laser diode 100 according to a tenth embodiment of the present invention in a longitudinal cross sectional view.

Referring to FIG. 15, the laser diode 100 is a is constructed on a substrate 101 of n-type InP on which a lower cladding layer 102 of n-type InP is provided epitaxially with a thickness of typically about 1500 nm.

On the lower cladding layer 102, a lower optical waveguide layer 103 of undoped GaInPAs having a bandgap wavelength of 1.3 μm is provided epitaxially with a thickness of 100 nm in lattice matching to the InP substrate 101, and an active layer 104 having a multiple quantum well (MQW) structure in which a quantum well layer of GaInNAsP having a bandgap wavelength of 1.55 μm and a barrier layer of GaInAsP having a bandgap wavelength of 1.3 ▲m are stacked alternately and repeatedly, is provided further on the optical waveguide layer 103 with a thickness of about 6 nm for the quantum well layer and a thickness of about 10 nm for the barrier layer. Thereby, the composition of the quantum well layer and the composition of the barrier layer are set so as to achieve a lattice matching to the InP substrate 101. The quantum well layer and the barrier layer may be repeated for 4 times. The GaInNAsP quantum well layer of the foregoing composition has a bandgap wavelength of about 1.55 μm while the GaInAsP barrier layer of the foregoing composition has a bandgap wavelength of about 1.3 μm.

Further, an upper optical waveguide layer 105 of GaInAsP is provided on the active layer 104 similarly to the lower optical waveguide layer 103 with a bandgap wavelength of 1.3 μm and a thickness of 100 nm in lattice matching to the InP substrate 101, and an upper cladding layer 106 of p-type InP is provided on the upper optical waveguide layer 105 with a thickness of typically about 3 nm.

Further, a cap layer 107 of p⁺-type InGaAs is provided on the upper cladding layer 106, and an upper ohmic electrode 108 having the AuZn/Zn stacked structure is provided on the cap layer 107. Further, a lower ohmic electrode 109 having the AuGe/Ni/Au stacked structure is provided on the lower major surface of the substrate 101.

Similarly to the laser diode 1 of FIG. 4A, the laser diode 100 is defined in the longitudinal or axial direction thereof by cleaved surfaces M1 and M2 that form an optical cavity. Further, the deposition of the layers 102–107 may be made in the deposition apparatus of FIG. 3 similarly to the process of forming the layers 2–6 of FIGS. 4A and 4B.

In the foregoing structure, it should be noted that the cladding layer 102 or 106 is free from Al, and the problem of oxidation of Al in the cladding layer at the time of the formation of the active layer 104 is successfully avoided.

In the laser diode 100, the oscillation wavelength of 1.55 μm is successfully achieved by incorporating a small amount of N into a conventional GaInPAs composition, while simultaneously maintaining a lattice matching to the InP substrate 101. The incorporation of N into GaInPAs mixed crystal composition decreases the bandgap and hence the laser oscillation wavelength. See the relationship of FIG. 1.

Figure 16A:
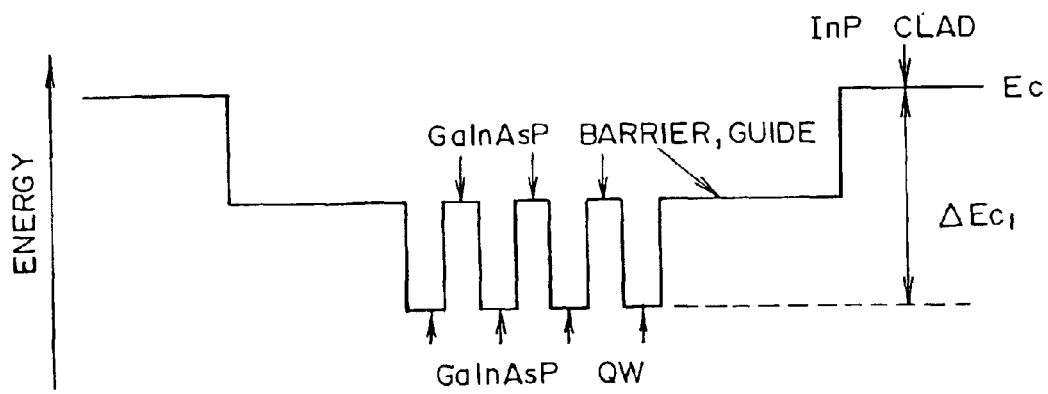
FIGS. 16A and 16B are diagrams respectively showing a band diagram of a conventional laser diode and a band diagram of the laser diode of FIG. 15.
Figure 16B:
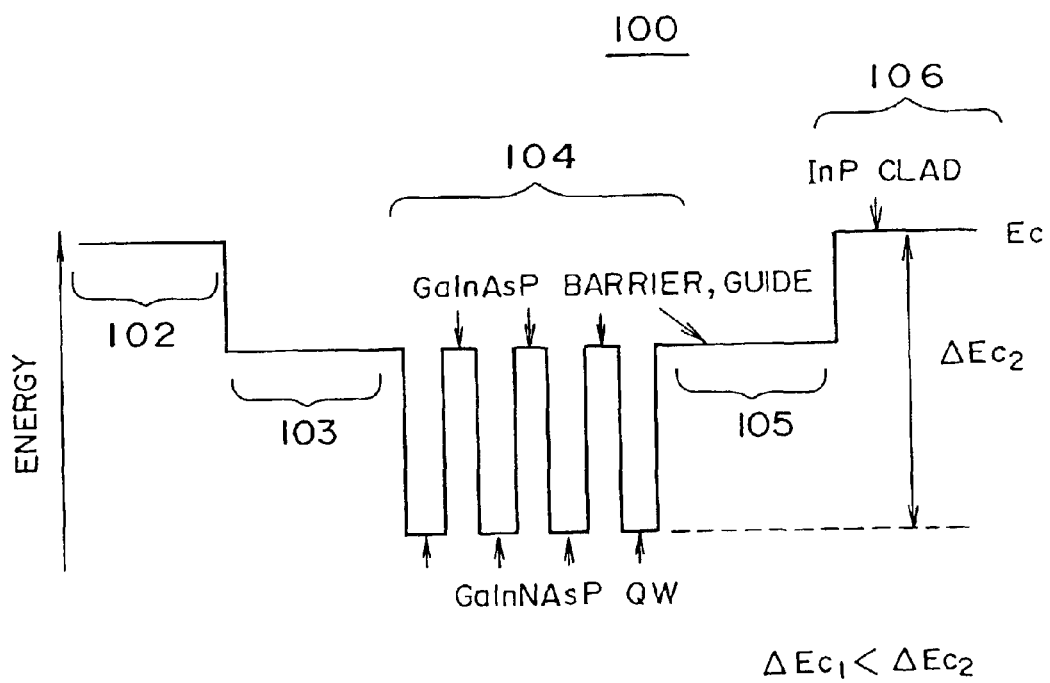

FIGS. 16A and 16B show the band structure of the conduction band Ec of the laser diode 100 taken along a vertical cross section, wherein FIG. 16A shows a conventional case of using GaInPAs for the quantum well while FIG. 16B shows the case of the present invention that uses GaInNPAs for the quantum well in the active layer 104.

Referring to FIGS. 16A and 16B, it will be noted that the band discontinuity ΔEc corresponding to the depth of the quantum well increases substantially when GaInNPAs is used ($\Delta Ec_2$) for the quantum well layer as compared with the case of conventional GaInPAs is used ($\Delta Ec_1$). Thereby, the overflowing of the carriers away from the active layer 104 is substantially suppressed in the laser diode 100 of the present embodiment, and the laser diode 100 shows an excellent high temperature performance.

In the present embodiment, the cladding layers 102 and 106 are not limited to InP but other composition such as $Ga_xIn_{1-x}As_yP_{1-y}$ ($0 \leq x < 1$, $0 \leq y \leq 1$) may also be used, provided that the cladding layers 102 and 106 have a bandgap energy larger than the bandgap energy of the barrier layer of the active layer 104 or the optical waveguide layers 103 and 105.

Further, it should be noted that a similar band structure is obtained also in the SCH-MQW laser diodes 60 and 70 explained already.

[Eleventh Embodiment]

Figure 17:
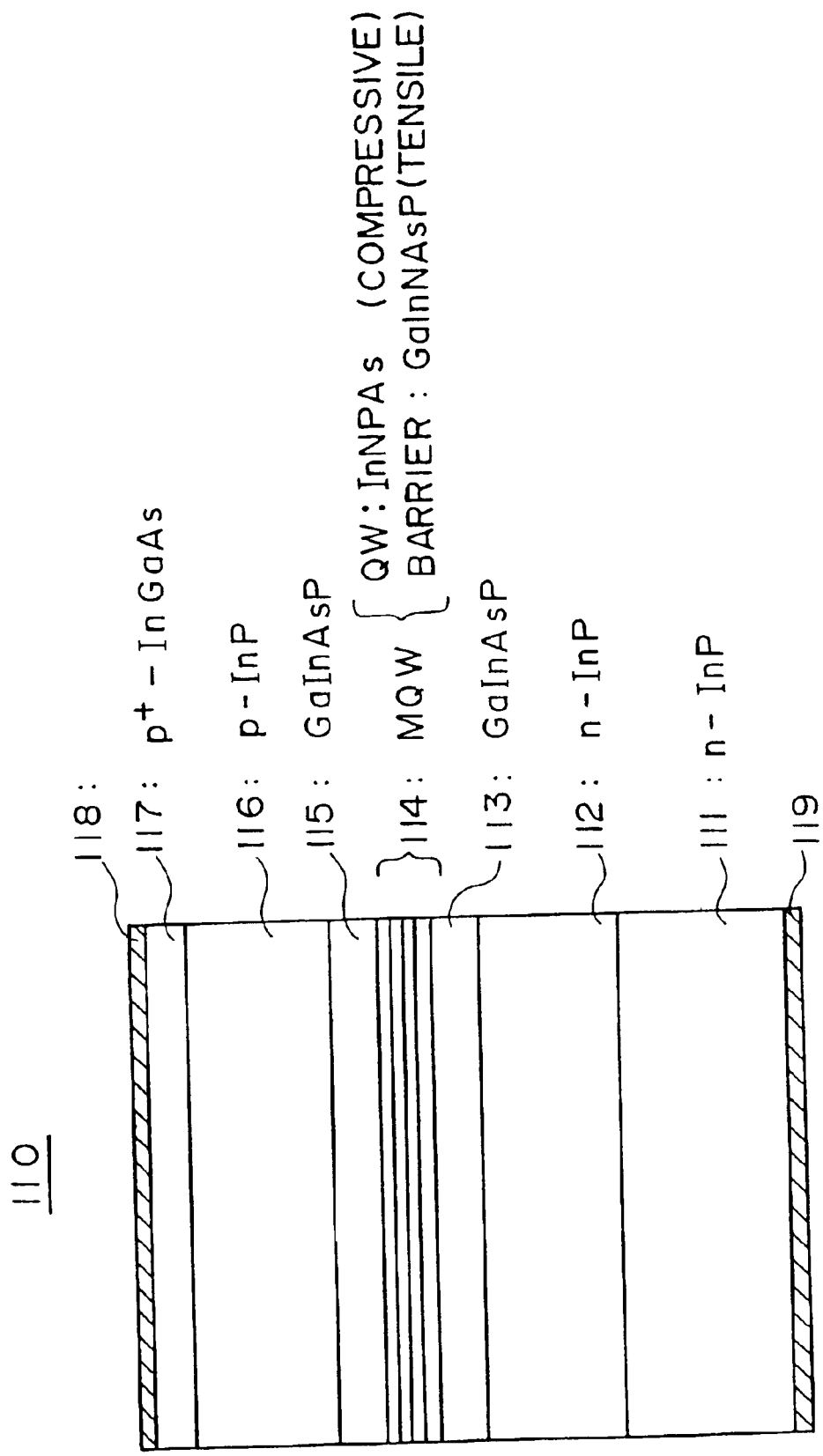
FIG. 17 is a diagram showing the construction of a laser diode according to an eleventh embodiment of the present invention in a longitudinal cross-sectional view.

FIG. 17 shows the construction of an SCH-MQW laser diode 110 according to an eleventh embodiment of the present invention in a longitudinal cross sectional view.

Referring to FIG. 17, the laser diode 110 is constructed on a substrate 111 of n-type InP on which a lower cladding layer 112 of n-type InP is provided epitaxially with a thickness of typically about 1500 nm.

On the lower cladding layer 112, a lower optical waveguide layer 113 of undoped GaInPAs having a bandgap wavelength of 1.3 μm is provided epitaxially with a thickness of 100 nm in lattice matching to the InP substrate 111, and an active layer 114 having a multiple quantum well (MQW) structure in which a quantum well layer of InNPAs having a bandgap wavelength of 1.55 μm and a barrier layer of GaInAsP having a bandgap wavelength of 1.3 μm are stacked alternately and repeatedly, is provided further on the optical waveguide layer 113 with a thickness of about 5.5 nm for the quantum well layer and a thickness of about 10 nm for the barrier layer. Thereby, the composition of the barrier layer is set so as to achieve a lattice matching to the InP substrate 111, while the composition of the quantum well layer is set such that the quantum well has a lattice constant exceeding the lattice constant of the InP substrate 111. The quantum well layer having such a composition accumulates therein a compressive lattice misfit strain. The quantum well layer and the barrier layer may be repeated for 4 times. The GaInNAsP quantum well layer of the foregoing composition has a bandgap wavelength of about 1.55 μm or larger while the GaInAsP barrier layer of the foregoing composition has a bandgap wavelength of about 1.3 μm.

As the InNPAs quantum well layer of the present embodiment has a reduced bandgap, only a small amount of N is sufficient for achieving the laser oscillation in the 1.55 μm band. As the amount of N introduced into the active layer is very small, the GaInNAsP mixed crystal forming the quantum well layer maintains an excellent quality and the laser diode 110 provides a sharp oscillation spectrum.

Further, an upper optical waveguide layer 115 of GaInPAs is provided on the active layer 114 similarly to the lower optical waveguide layer 113 with a bandgap wavelength of 1.3 μm and a thickness of 100 nm in lattice matching to the InP substrate 111, and an upper cladding layer 116 of p-type InP is provided on the upper optical waveguide layer 115 with a thickness of typically about 1500 nm.

Further, a cap layer 117 of p⁺-type InGaAs is provided on the upper cladding layer 116, and an upper ohmic electrode 118 having the AuZn/Zn stacked structure is provided on the cap layer 117. Further, a lower ohmic electrode 119 having the AuGe/Ni/Au stacked structure is provided on the lower major surface of the substrate 111.

Similarly to the laser diode 1 of FIG. 4A, the laser diode 110 is defined in the longitudinal or axial direction thereof by cleaved surfaces M1 and M2 that form an optical cavity. Further, the deposition of the layers 112–117 may be made in the deposition apparatus of FIG. 3 similarly to the process of forming the layers 2–6 of FIGS. 4A and 4B.

In the foregoing structure, it should be noted that the cladding layer 112 or 116 is free from Al, and the problem of oxidation of Al in the cladding layer at the time of the low-temperature formation of the MQW active layer 114 is successfully avoided.

Further, the laser diode structure of FIG. 17 is effective for confining the carriers in the active layer 114 due to the large band discontinuity ΔEc similarly to the case of FIG. 16B. Thereby, the laser diode shows an excellent performance at high temperatures without a temperature regulation.

In the present embodiment, it should be noted that the GaInNAsP quantum well layer in the active layer 114 may accumulate a tensile lattice misfit strain in place of a compressive lattice misfit strain.

[Twelfth Embodiment]

Figure 18:
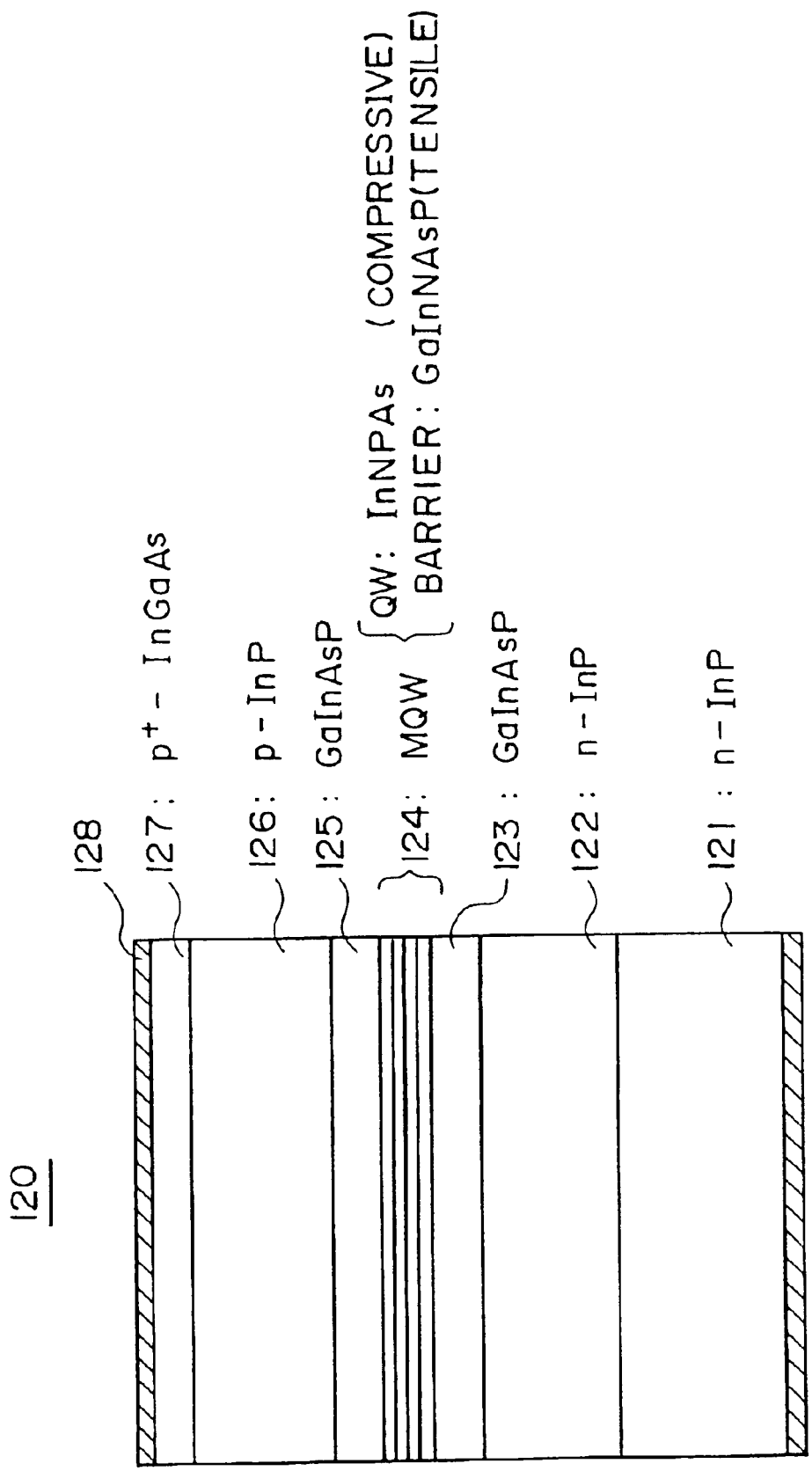
FIG. 18 is a diagram showing the construction of a laser diode according to a twelfth embodiment of the present invention in a longitudinal cross-sectional view.

FIG. 18 shows the construction of an SCH-MQW laser diode 120 according to a twelfth embodiment of the present invention in a longitudinal cross sectional view.

Referring to FIG. 18, the laser diode 120 is a is constructed on a substrate 121 of n-type InP on which a lower cladding layer 122 of n-type InP is provided epitaxially with a thickness of typically about 1500 nm.

On the lower cladding layer 122, a lower optical waveguide layer 123 of undoped GaInPAs having a bandgap wavelength of 1.3 μm is provided epitaxially with a thickness of 100 nm in lattice matching to the InP substrate 121, and an active layer 124 having a multiple quantum well (MQW) structure in which a quantum well layer of GaInNAsP having a bandgap wavelength of 1.55 μm and a barrier layer of GaInAsP having a bandgap wavelength of 1.3 μm are stacked alternately and repeatedly, is provided further on the optical waveguide layer 123 with a thickness of about 4 nm for the quantum well layer and a thickness of about 10 nm for the barrier layer. Thereby, the compositions of the quantum well layer and the composition of the barrier layer are set such that the quantum well has a lattice constant exceeding the lattice constant of the InP substrate 121 while the barrier layer has a lattice constant smaller than the lattice constant of the InP substrate. Thereby, the quantum well layer accumulates therein a compressive lattice misfit strain, while the barrier layer accumulates therein a compensating tensile lattice misfit strain. The quantum well layer and the barrier layer may be repeated for 6 times. As the compressive lattice misfit strain of the quantum well layer is compensated for by the tensile lattice misfit strain of the barrier layer, the stacking of the quantum well layer and the barrier layer may be repeated as desired. The GaInNAsP quantum well layer of the foregoing composition has a bandgap wavelength of about 1.55 μm or larger while the GaInAsP barrier layer of the foregoing composition has a bandgap wavelength of about 1.3 μm.

As the GaInNAsP quantum well layer of the present embodiment is strained, the quantum well layer inherently has a reduced bandgap. Thus, only a small amount of N is sufficient for achieving the laser oscillation in the 1.55 μm band. As the amount of N introduced into the active layer is very small, the GaInNAsP mixed crystal forming the quantum well layer maintains an excellent quality and the laser diode 120 provides a sharp oscillation spectrum.

Further, an upper optical waveguide layer 125 of GaInAsP is provided on the active layer 124 similarly to the lower optical waveguide layer 123 with a bandgap wavelength of 1.3 μm and a thickness of 1500 nm in lattice matching to the InP substrate 121, and an upper cladding layer 126 of p-type InP is provided on the upper optical waveguide layer 125 with a thickness of typically about 1500 nm.

Further, a cap layer 127 of p⁺-type InGaAs is provided on the upper cladding layer 126, and an upper ohmic electrode 128 having the AuZn/Zn stacked structure is provided on the cap layer 127. Further, a lower ohmic electrode 129 having the AuGe/Ni/Au stacked structure is provided on the lower major surface of the substrate 121.

Similarly to the laser diode 1 of FIG. 4A, the laser diode 120 is defined in the longitudinal or axial direction thereof by cleaved surfaces M1 and M2 that form an optical cavity. Further, the deposition of the layers 122–127 may be made in the deposition apparatus of FIG. 3 similarly to the process of forming the layers 2–6 of FIGS. 4A and 4B.

In the foregoing structure, it should be noted that the cladding layer 122 or 126 is free from Al, and the problem of oxidation of Al in the cladding layer at the time of the low-temperature formation of the MQW active layer 124 is successfully avoided.

Further, the laser diode structure of FIG. 18 is effective for confining the carriers in the active layer 124 due to the large band discontinuity ΔEc similarly to the case of FIG. 16B. Thereby, the laser diode shows an excellent performance at high temperatures without a temperature regulation.

In the present embodiment, it should be noted that the GaInNAsP quantum well layer in the active layer 124 may accumulate a tensile lattice misfit strain in place of a compressive lattice misfit strain. In this case, the GaInNAsP barrier layer accumulates a compressive lattice misfit strain.

[Thirteenth Embodiment]

Figure 19:
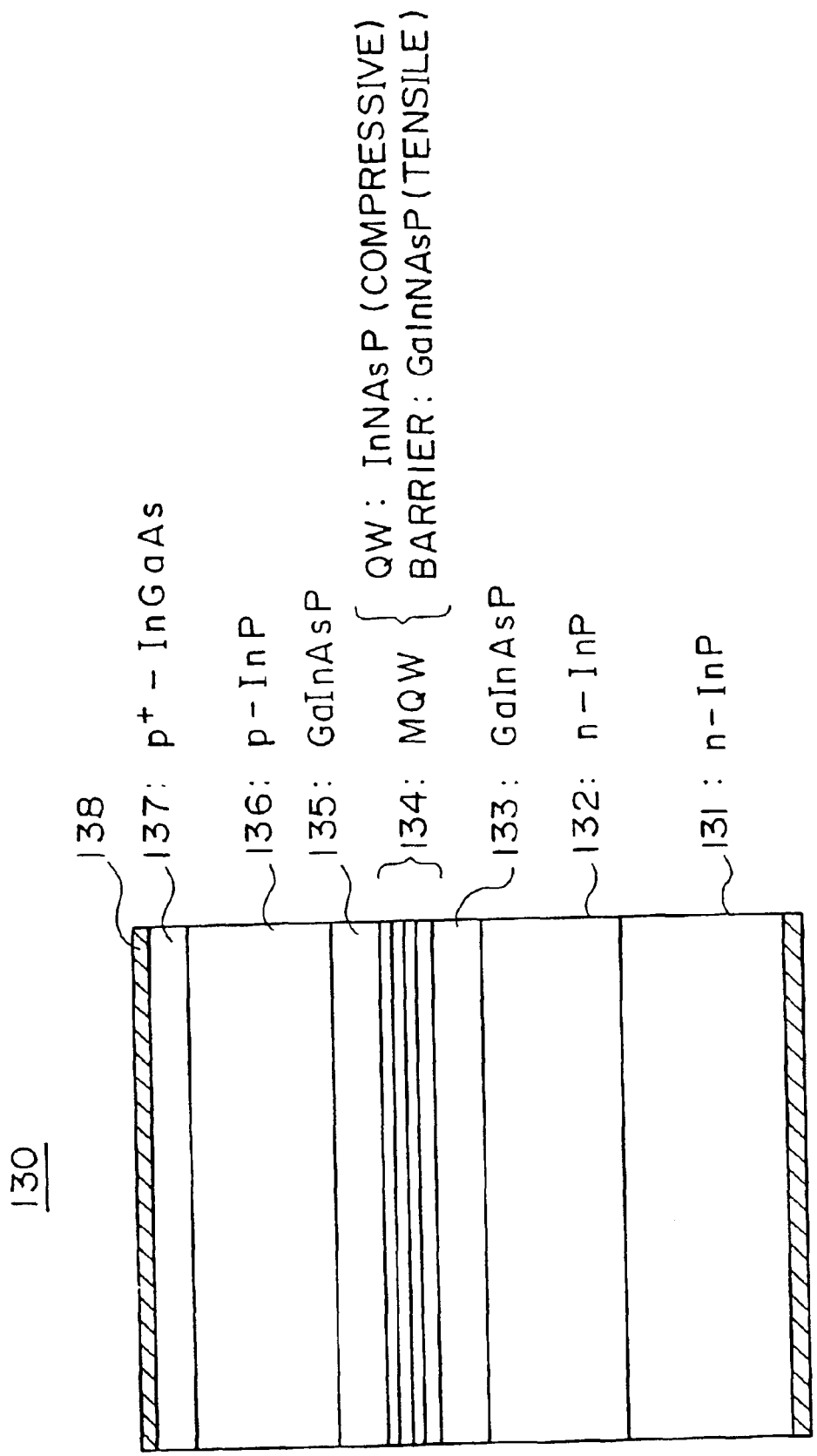
FIG. 19 is a diagram showing the construction of a laser diode according to a thirteenth embodiment of the present invention in a longitudinal cross-sectional view.

FIG. 19 shows the construction of an SCH-MQW laser diode 130 according to a thirteenth embodiment of the present invention in a longitudinal cross sectional view.

Referring to FIG. 19, the laser diode 130 is a is constructed on a substrate 131 of n-type InP on which a lower cladding layer 132 of n-type InP is provided epitaxially with a thickness of typically about 1500 nm.

On the lower cladding layer 132, a lower optical waveguide layer 133 of undoped GaInPAs having a bandgap wavelength of 1.3 μm is provided epitaxially with a thickness of 100 nm in lattice matching to the InP substrate 131, and an active layer 134 having a multiple quantum well (MQW) structure in which a quantum well layer of InNAsP having a bandgap wavelength of 1.55 μm and a barrier layer of GaInNAsP having a bandgap wavelength of 1.3 μm are stacked alternately and repeatedly, is provided further on the optical waveguide layer 133 with a thickness of about 5.5 nm for the quantum well layer and a thickness of about 10 nm for the barrier layer. Thereby, the compositions of the quantum well layer and the composition of the barrier layer are set such that the quantum well has a lattice constant exceeding the lattice constant of the InP substrate 131 while the barrier layer has a lattice constant smaller than the lattice constant of the InP substrate 131. Thereby, the quantum well layer of InNAsP accumulates therein a compressive lattice misfit strain, while the barrier layer of GaInNAsP accumulates therein a compensating tensile lattice misfit strain. The quantum well layer and the barrier layer may be repeated for 4 times. As the compressive lattice misfit strain of the quantum well layer is compensated for by the tensile lattice misfit strain of the barrier layer, the stacking of the quantum well layer and the barrier layer may be repeated as desired. The InNAsP quantum well layer of the foregoing composition has a bandgap wavelength of about 1.55 μm or larger while the GaInAsP barrier layer of the foregoing composition has a bandgap wavelength of about 1.3 μm.

As the InNPAs quantum well layer of the present embodiment has a reduced bandgap, only a small amount of N is sufficient for achieving the laser oscillation in the 1.55 μm band. As the amount of N introduced into the active layer is very small, the InNAsP mixed crystal forming the quantum well layer maintains an excellent quality and the laser diode 130 provides a sharp oscillation spectrum.

Further, an upper optical waveguide layer 135 of GaInAsP is provided on the active layer 134 similarly to the lower optical waveguide layer 133 with a bandgap wavelength of 1.3 μm and a thickness of about 100 nm in lattice matching to the InP substrate 131, and an upper cladding layer 136 of p-type InP is provided on the upper optical waveguide layer 135 with a thickness of typically about 1500 nm.

Further, a cap layer 137 of p$^+$-type InGaAs is provided on the upper cladding layer 136, and an upper ohmic electrode 138 having the AuZn/Zn stacked structure is provided on the cap layer 137. Further, a lower ohmic electrode 129 having the AuGe/Ni/Au stacked structure is provided on the lower major surface of the substrate 131.

Similarly to the laser diode 1 of FIG. 4A, the laser diode 130 is defined in the longitudinal or axial direction thereof by cleaved surfaces M1 and M2 that form an optical cavity. Further, the deposition of the layers 132–137 may be made in the deposition apparatus of FIG. 3 similarly to the process of forming the layers 2–6 of FIGS. 4A and 4B.

In the foregoing structure, it should be noted that the cladding layer 132 or 136 is free from Al, and the problem of oxidation of Al in the cladding layer at the time of the low-temperature formation of the MQW active layer 134 is successfully avoided.

Further, the laser diode structure of FIG. 19 is effective for confining the carriers in the active layer 134 due to the large band discontinuity ΔEc similarly to the case of FIG. 16B. Thereby, the laser diode shows an excellent performance at high temperatures without a temperature regulation.

In the present embodiment, it should be noted that the InNAsP quantum well layer in the active layer 134 may accumulate a tensile lattice misfit strain in place of a compressive lattice misfit strain. In this case, the GaInNAsP barrier layer accumulates a compressive lattice misfit strain. As the barrier layer and the quantum well layer in the active layer 134 both contain N, the alternate deposition of the barrier layer and the quantum well layer can be achieved in the deposition apparatus of FIG. 3 by continuously supplying the gaseous sources of TMI or TEI, DMHy, AsH$_3$ and PH$_3$, while switching the supply of TMGa on and off repeatedly. Thereby, the MQW structure of the active layer 134 is formed easily and efficiently. As the supply of DMHy, which has to be supplied with a substantial flow rate, is made continuous, the gas flow in the reaction chamber 11 is stabilized, and the epitaxial growth of the quantum well layers and the barrier layers is achieved with excellent reproducibility.

[Fourteenth Embodiment]

Heretofore, it was assumed that the various laser diodes has a ridge guide structure as indicated in the end view of FIG. 4B. On the other hand, a laser diode generally uses a current confinement structure for confining the injected carrier to a small region in the active layer such that the laser oscillation occurs in such a small region with high efficiency.

Figure 20:
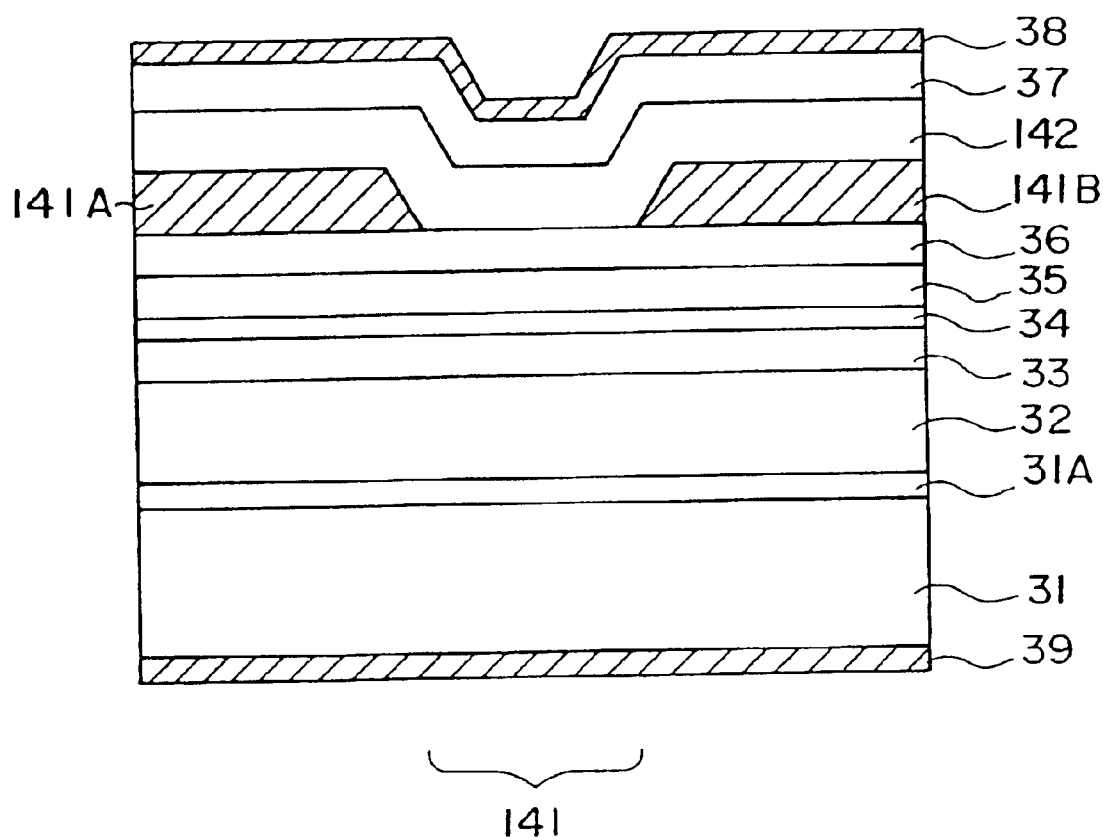
FIG. 20 is a diagram showing the construction of a laser diode according to a fourteenth embodiment of the present invention in an end view.

Thus, FIG. 20 shows a stripe laser diode 140 according to a fourteenth embodiment of the present invention in an end view, wherein the laser diode 140 is a modification of the ridge-waveguide laser diode 30 of FIG. 8. However, it should be noted that the current confinement structure of the present embodiment is applicable not only to the laser diode 30 but to any of the laser diode structures described heretofore in the preceding embodiments. In FIG. 20, those parts corresponding to the parts described previously are designated by the same reference numerals and the description thereof will be omitted.

Referring to FIG. 20, the laser diode 140 now includes a buffer layer 31A as of n-type GaAs on the GaAs substrate 31, and the upper cladding layer 36 carries thereon a pair of current block regions 141A and 141B disposed symmetrically at both lateral sides of a stripe region 141 of the laser diode, in which the optical radiation is to be confined. In the illustrated example, the current blocking regions 141A and 141B are both formed of n-type GaInNAs grown epitaxially on the upper cladding layer 36, and a second upper cladding layer 142 of p-type AlGaAs is provided further thereon in contact with the upper cladding layer 36 at the foregoing stripe region and so as to bury the current blocking regions 141A and 141B underneath. Thereby, the contact layer 37 is provided so as to cover the second upper cladding layer 142, and the upper ohmic electrode 38 covers the contact layer 37.

By providing the n-type regions 141A and 141B, the drive current (holes) injected at the ohmic electrode 38 to the contact layer 37 is successfully confined to the foregoing stripe region 141 due to the p-n junction and associated depletion region formed at the interface of the current blocking structure 141A or 141B to the cladding layer 142.

It should be noted that the current blocking regions 141A and 141B has a composition identical to the composition of the GaInNAs forming the active layer 34 or a composition that provides a bandgap energy smaller than the bandgap energy of the active layer 34. Thereby, the current blocking regions 141A and 141B absorb the optical radiation emitted in the active layer 34, while such an optical absorption induces a refractive index change in the current blocking regions 141A and 141B. Thus, the optical radiation is guided, due to the refraction index difference thus induced, along the strip region in the axial direction of the laser diode, and the stimulated emission occurs efficiently in such a strip region where the optical radiation is thus concentrated.

It should be noted that the structure of FIG. 20 is formed easily, by forming a GaInNAs layer on the upper cladding layer, followed by a photolithographic patterning process of the same into the foregoing current blocking regions 141A and 141B.

Further, in view of the fact that the current blocking regions 141A and 141B contain N therein, it is also possible or even more preferable to use GaInP or GaInPAs mixed crystal for the cladding layers 36 and 142 as in the case of the laser diode 20 of FIG. 7 or 80 of FIG. 13. Further, any n-type semiconductor material, such as GaInAs, GaAlAs, GaInPAs, and the like, that can absorb the optical radiation produced in the active layer 34 may be used for the current blocking regions 141A and 141B.

Figure 21:
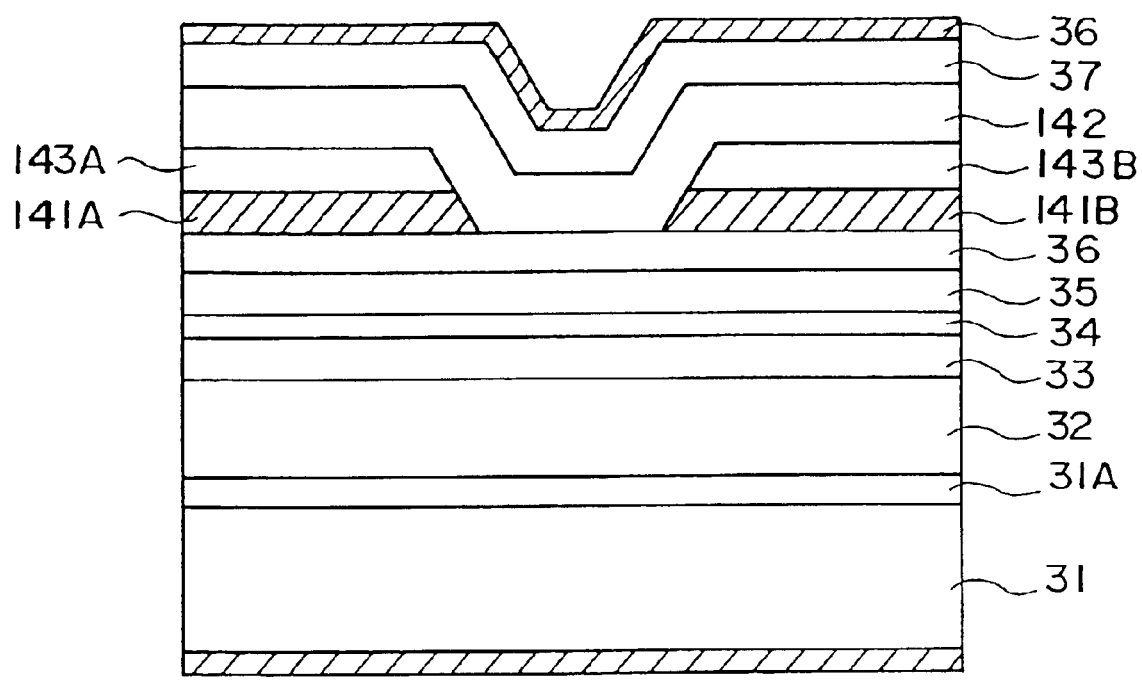
FIG. 21 is a diagram showing a modification of the laser diode of FIG. 20.

FIG. 21 shows a modification of the laser diode 140 of FIG. 20.

Referring to FIG. 21, the laser diode 140 includes an n-type GaAs layer 143A on the current blocking region 141A and an n-type GaAs layer 143B on the current blocking region 141B, while the region 141A or 141B itself is formed of an undoped GaInNAs that absorbs the optical radiation produced in the active layer 34. In this case, the n-type GaAs layer 143A or 143B acts as the current blocking structure while the GaInNAs region 141A or 141B forms a lateral optical waveguide. Further, the optical waveguide region 141A and the current blocking region 143A thereon or the optical waveguide region 141B and the current blocking region 143B thereon may be interchanged.

As noted already, the current confinement structure of FIG. 20 or 21 is applicable to any of the laser diode structures 10–130 described heretofore with various embodiments.

Further, the present invention is applicable also to DFB laser diodes or DBR laser diodes that use a diffraction corrugation in place of the mirrors M1 and M2.

Further, the present invention is not limited to the embodiments described heretofore, but various variations and modifications may be made without departing from the scope of the invention.

What is claimed is:

1. A semiconductor device, comprising:
    a GaAs substrate;
    an active layer provided over said substrate, said active layer containing N and a group V element other than N; and
    another layer free from Al formed adjacent to said active layer at either one side or both sides thereof, said another layer having a composition represented as $Ga_dIn_{1-d}N_eAs_fP_{1-e-f}$ ($0 \leq d \leq 1$, $0 \leq e < 1$, $0 \leq f \leq 1$) and excluding GaAs.

2. A semiconductor device as claimed in claim 1, wherein said another layer contains N, and said semiconductor device comprises a further layer free from Al provided at an outer side of said another layer at a side of said another layer away from said active layer.

3. A semiconductor device as claimed in claim 2, wherein said further layer has a composition represented as $Ga_dIn_{1-d}N_eAs_fP_{1-e-f}$ ($0 \leq d \leq 1$, $0 \leq e < 1$, $0 \leq f \leq 1$).

4. A semiconductor device, comprising:
    a GaAs substrate;
    an active layer provided over said GaAs substrate, said active layer containing N and a group V element other than N; and
    another layer free from Al formed adjacent to said active layer at either one side or both sides thereof, said another layer containing N and a group V element other than N.

5. A semiconductor device as claimed in claim 4, wherein said semiconductor device comprises a further layer free from Al provided at an outer side of said another layer at a side of said another layer away from said active layer.

6. A semiconductor device as claimed in claim 5, wherein said further layer has a composition represented as $Ga_dIn_{1-d}N_eAs_fP_{1-e-f}$ ($0 \leq d \leq 1$, $0 \leq e < 1$, $0 \leq f \leq 1$).

7. A semiconductor device, comprising:
    a substrate formed of GaAs;
    an active layer provided over said substrate, said active layer containing N and a group V element other than N; and
    another layer free from Al provided adjacent to said active layer at one side or both sides thereof, said another layer containing N and a group V element other than N, and said active layer and said another layer accumulating therein a strain of respective, different types.

8. A semiconductor device as claimed in claim 7, wherein said active layer accumulates therein a compressive strain and said another layer accumulates therein a tensile strain.

9. A semiconductor device as claimed in claim 7, wherein said another layer contains N, and said semiconductor device comprises a further layer free from Al provided at an outer side of said another layer at a side of said another layer away from said active layer.

10. An optical semiconductor device, comprising:
    a GaAs substrate; and
    an active region provided over said GaAs substrate, said active region at least comprising: a quantum well layer containing N and a group V element other than N, said quantum well layer acting as a light-emitting layer; and another layer free from Al contacting to said quantum well layer at one side or both sides of said quantum well layer, said another layer containing N and a group V element other than N.

11. An optical semiconductor device as claimed in claim 10, wherein said quantum well layer and said another layer accumulate therein a strain of respective, different types.

12. A semiconductor device, comprising:
    a substrate;
    an active layer provided over said substrate, said active layer containing N and a group V element other than N;
    a semiconductor layer containing Al interposed between said substrate and said active layer;
    another layer free from Al provided adjacent to said active layer at either one side or both sides thereof, said another layer containing N and a group V element other than N; and
    a further layer free from Al provided between said semiconductor layer containing Al and said another layer at a side away from said active layer.

13. A semiconductor device as claimed in claim 12, wherein said further layer has a composition represented as $Ga_dIn_{1-d}N_eAs_fP_{1-e-f}$ ($0 \leq d \leq 1$, $0 \leq e < 1$, $0 \leq f \leq 1$).

* * * * *